United States Patent
Fukuyama

(10) Patent No.: US 6,510,097 B2
(45) Date of Patent: Jan. 21, 2003

(54) DRAM INTERFACE CIRCUIT PROVIDING CONTINUOUS ACCESS ACROSS ROW BOUNDARIES

(75) Inventor: Hiroyuki Fukuyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/985,237

(22) Filed: Nov. 2, 2001

(65) Prior Publication Data

US 2002/0110037 A1 Aug. 15, 2002

(30) Foreign Application Priority Data

Feb. 15, 2001 (JP) ........................ 2001-037990

(51) Int. Cl.[7] ............................... G11C 8/00
(52) U.S. Cl. ..................... 365/230.03; 365/230.06; 365/233.5
(58) Field of Search ................ 365/230.03, 230.06, 365/230.08, 230.09, 233.5, 238.5, 189.09, 189.05

(56) References Cited

U.S. PATENT DOCUMENTS 5,689,470 A * 11/1997 Inoue .................. 365/203
5,745,913 A * 4/1998 Pattin et al. ............. 711/105

FOREIGN PATENT DOCUMENTS

| JP | 8-129881 | 5/1996 |
| JP | 9-106669 | 4/1997 |

* cited by examiner

Primary Examiner—Michael S. Lebentritt
Assistant Examiner—Hien Nguyen
(74) Attorney, Agent, or Firm—Volentine Francos, PLLC

(57) ABSTRACT

An interface circuit controls access to a dynamic random-access memory having multiple banks, each bank having multiple rows of memory cells, according to received address signals. The address signals are decoded in such a way that when access to a consecutive series of addresses crosses from a first row to a second row, these two rows are always disposed in separate banks. The second row is activated during access to the first row, and the first row is precharged during access to the second row, enabling access to proceed without interruption across the row boundary. In particular, burst access can proceed from row to row continuously.

28 Claims, 9 Drawing Sheets

DRAM INTERFACE CIRCUIT PROVIDING CONTINUOUS ACCESS ACROSS ROW BOUNDARIES

BACKGROUND OF THE INVENTION

1. Field of the Invention

The present invention relates to an interface circuit that controls access to a dynamic random-access memory.

2. Description of the Related Art

Dynamic random-access memory (DRAM) is used in many types of computing devices and is accessed by many types of processors. A DRAM interface circuit generates signals that control the reading and writing of data in a DRAM. The DRAM interface circuit may be integrated into a microprocessor.

Before a memory cell in a DRAM can be accessed, the row in which the memory cell is located must be activated. One of the functions of a DRAM interface circuit is to decide whether a row to be accessed is active, and if it is not, to activate it before beginning read or write access to the row. Another function is to deactivate a row when access shifts to a new row.

One type of DRAM developed for high-speed access is synchronous DRAM (SDRAM), which operates in synchronization with a clock signal and permits burst access to a plurality of memory cells in different columns in a row. Japanese Unexamined Patent Publication No. 9-106669 describes a DRAM interface circuit that extends this burst access capability to memory cells in different banks of an SDRAM.

When a conventional DRAM interface circuit performs access to a consecutive series of addresses spanning two banks, however, it exhausts the rows in the first bank before proceeding to access the second bank. Row transitions thus occur mainly within the same bank. The DRAM interface circuit in Japanese Unexamined Patent Publication No. 9-106669 permits continuous access to continue when a row transition from one bank to another occurs, but when access changes from a first row to a second row in the same bank, before issuing any Read or Write commands for the second row, the DRAM interface circuit must issue a Precharge command to deactivate the first row, wait for the precharge operation to be completed, then issue an Active command to activate the second row and wait for the second row to become active. Access is therefore interrupted for a considerable time while the first row is being deactivated and the second row is being activated. As a result, the total access time is lengthened.

SUMMARY OF THE INVENTION

An object of the present invention is to provide a DRAM interface circuit that enables continuous access to a continuous series of addresses, regardless of whether or not the series crosses a row boundary.

The invented DRAM interface circuit controls access to a DRAM according to received address signals. The DRAM has a plurality of banks, each bank having memory cells disposed in a plurality of rows. The DRAM interface circuit includes an address decoder and an active/precharge command generator. The address decoder decodes the address signals so that if a series of address signals is received in a consecutive address sequence, whenever the series includes a transition from a first row to a second row, the first row and the second row are disposed in different banks in the dynamic random-access memory. For example, the address decoder may place the row address bits in more significant bit positions than the bank address bits, the reverse of the conventional practice. The active/precharge command generator activates the second row while the first row is being accessed, and precharges the first row while the second row is being accessed.

During consecutive address access, all row-to-row transitions occur between different banks, so access can proceed continuously from one row to the next, the new row already having been activated before the row transition occurs, and the old row being precharged during access to the new row. In particular, burst access can proceed continuously from one row to the next.

The above-mentioned second row may be activated when access to the first row begins, but the second row is more preferably activated when access reaches a designated column in the first row, most preferably a column near the end of the first row, so that power is not consumed needlessly by activating the second row earlier than necessary.

The invented DRAM interface circuit may also be used to control access to a plurality of DRAMs. The consecutive address sequence extends across the plurality of DRAMs. If the first and second rows mentioned above are disposed in a first DRAM, and a third row, directly following the second row in the address sequence, is disposed in a second DRAM, then access to the second row is briefly interrupted in order to select the second DRAM and issue an activation command for the third row. Access to the second row resumes as soon as the activation command has been issued. At the end of access to the second row, the second row is precharged, then the second DRAM is selected and the third row, which is already active, is accessed. Access to consecutive addresses can thus proceed substantially continuously from one DRAM to the next.

The DRAM or DRAMs controlled by the invented interface circuit may be, for example, synchronous DRAM cores integrated together with the invented interface circuit and a central processing unit in a single semiconductor chip, such as a microprocessor chip.

DETAILED DESCRIPTION OF THE INVENTION

Figure 1:
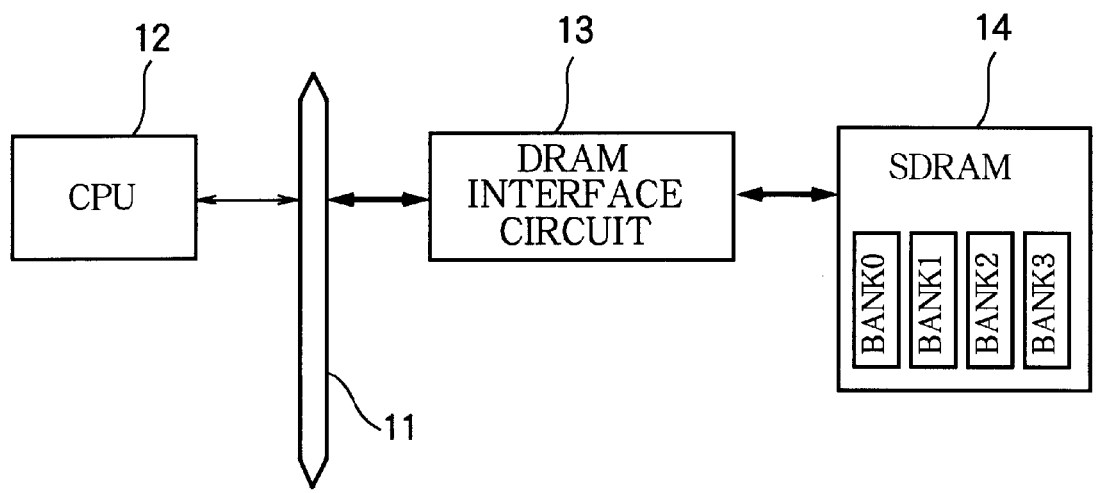
FIG. 1 is a block diagram of a microprocessor including the invented DRAM interface circuit.

Embodiments of the invention will be described with reference to the attached drawings, in which like parts are indicated by like reference characters.

FIG. 1 is a block diagram of a microprocessor illustrating a first embodiment of the invention. The microprocessor in FIG. 1 includes an internal bus 11, a central processing unit (CPU) 12, a DRAM interface circuit 13 linked by the internal bus 11 to the CPU 12, and a synchronous DRAM (SDRAM) 14 connected to the DRAM interface circuit 13.

The DRAM interface circuit 13 controls read and write access to the SDRAM 14 according to address signals and other control signals, such as a read signal and a write signal, received via the internal bus 11. The address signals may be generated by the CPU 12, or by an address signal generating circuit, a magnetic recording device, or some other circuit or device (not visible) connected to the internal bus 11, in which case the address signals are generated according to control signals from the CPU 12 and are then output on the internal bus 11.

Figure 3:
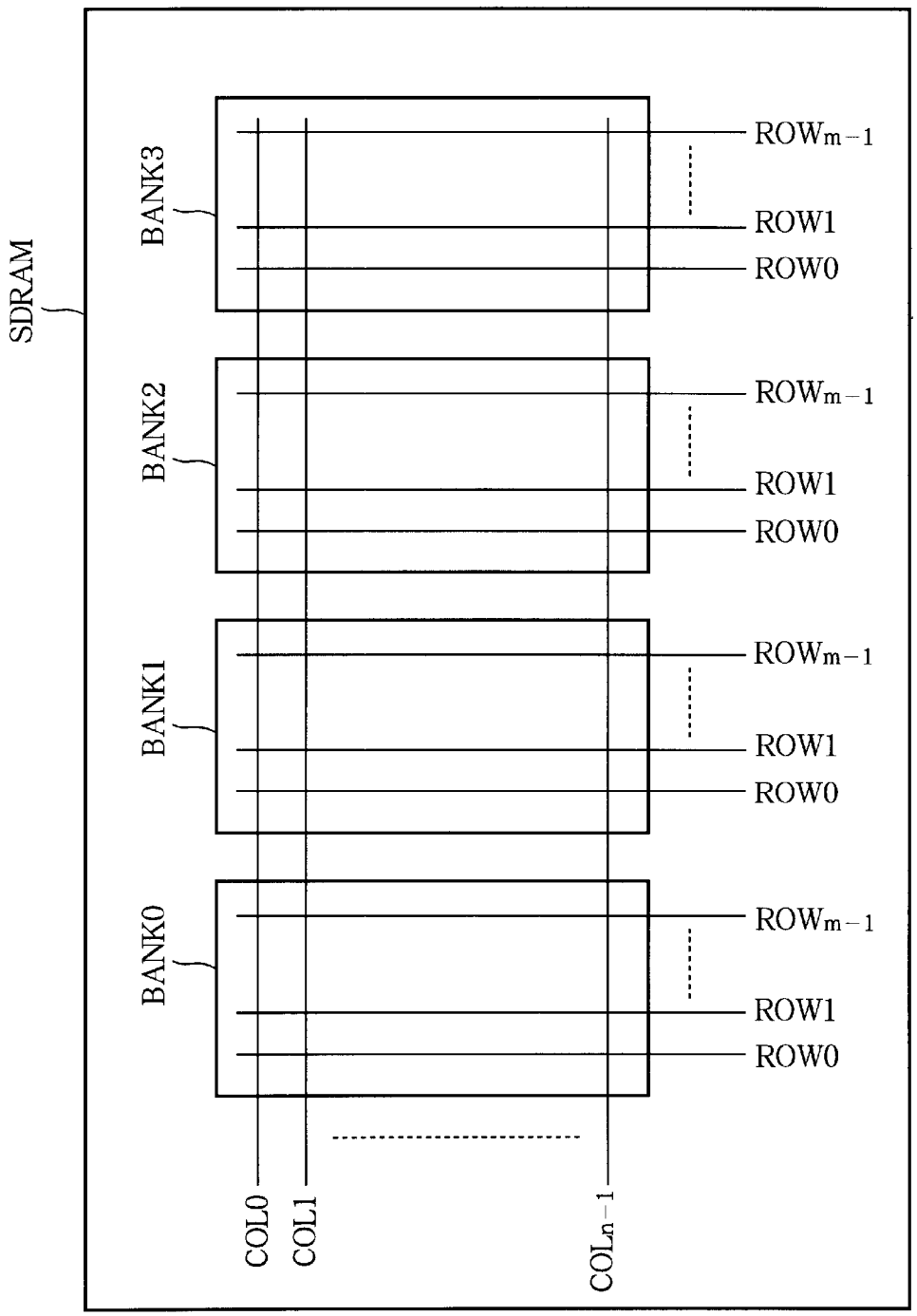
FIG. 3 shows an example of the bank structure of a synchronous DRAM controllable by the invented DRAM interface circuit.

Referring to FIG. 3, the SDRAM 14 has four banks (BANK0, BANK1, BANK2, BANK3), each including m rows (ROW0, ROW1, . . . , ROWm−1), where m is a positive integer. The total number of rows in the SDRAM 14 is accordingly 4×m. The SDRAM 14 also has n columns (COL0, COL1, . . . , COLn−1).

The memory cells in the SDRAM 14 are selected according to these rows and columns. The 4×m rows are selected according to a row address and a bank address, which are decoded from the address signals. The n columns are selected by a column address, also decoded from the address signals.

Figure 2:
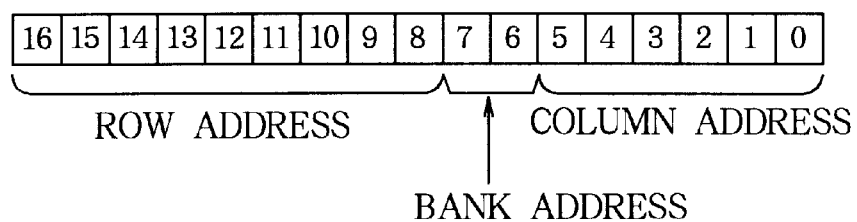
FIG. 2 shows an example of address bit assignments suitable for use in the DRAM interface circuit in FIG. 1.

Referring to FIG. 2, the DRAM interface circuit 13 decodes the input address signals to seventeen-bit address data, including a nine-bit row address followed by a two-bit bank address and a six-bit column address. If the nine-bit row address is r8r7r6r5r4r3r2r1r0, the two-bit bank address is b1b0, and the six-bit column address is c5c4c3c2c1c0, then the seventeen bits of address data are r8r7r6r5r4r3r2r1r0b1b0c5c4c3c2c1c0.

In access to consecutive addresses, the address is incremented by one at a time. Since the row address occupies the most significant bit positions of the address data, the bank address occupies the middle bit positions, and the column address occupies the least significant bit positions, the bank address is incremented when the column address changes from 111111 to 000000, and the row address is incremented when the bank address changes from 11 to 00.

If all addresses are accessed consecutively, the first row to be accessed is ROW0 in BANK0, followed by ROW0 in BANK1, ROW0 in BANK2, ROW0 in BANK3, ROW1 in BANK0, and so on, concluding with ROWm−1 in BANK2 and finally ROWm−1 in BANK3. In consecutive address access, accordingly, whenever the row changes, the bank also changes.

In the SDRAM 14, if an arbitrary first row and an arbitrary second row are disposed in different banks, the first row and second row can be activated simultaneously, the second row can be activated while the first row is being accessed, and the first row can be precharged while the second row is being accessed.

Accordingly, in access to consecutive addresses given by the seventeen-bit address data described above, since two consecutively accessed rows are always disposed in different banks, the second of the two rows can be activated while the first of the two rows is being accessed, and the first row can be precharged while the second row is being accessed.

For brevity, row address r8r7r6r5r4r3r2r1r0 and bank address b1b0 will sometimes be referred to below as row/bank address r8r7r6r5r4r3r2r1r0/b1b0, and row address r8r7r6r5r4r3r2r1r0, bank address b1b0, and column address c5c4c3c2c1c0 will sometimes be referred to as row/bank/column address r8r7r6r5r4r3r2r1r0/b1b0/c5c4c3c2c1c0.

Figure 4:
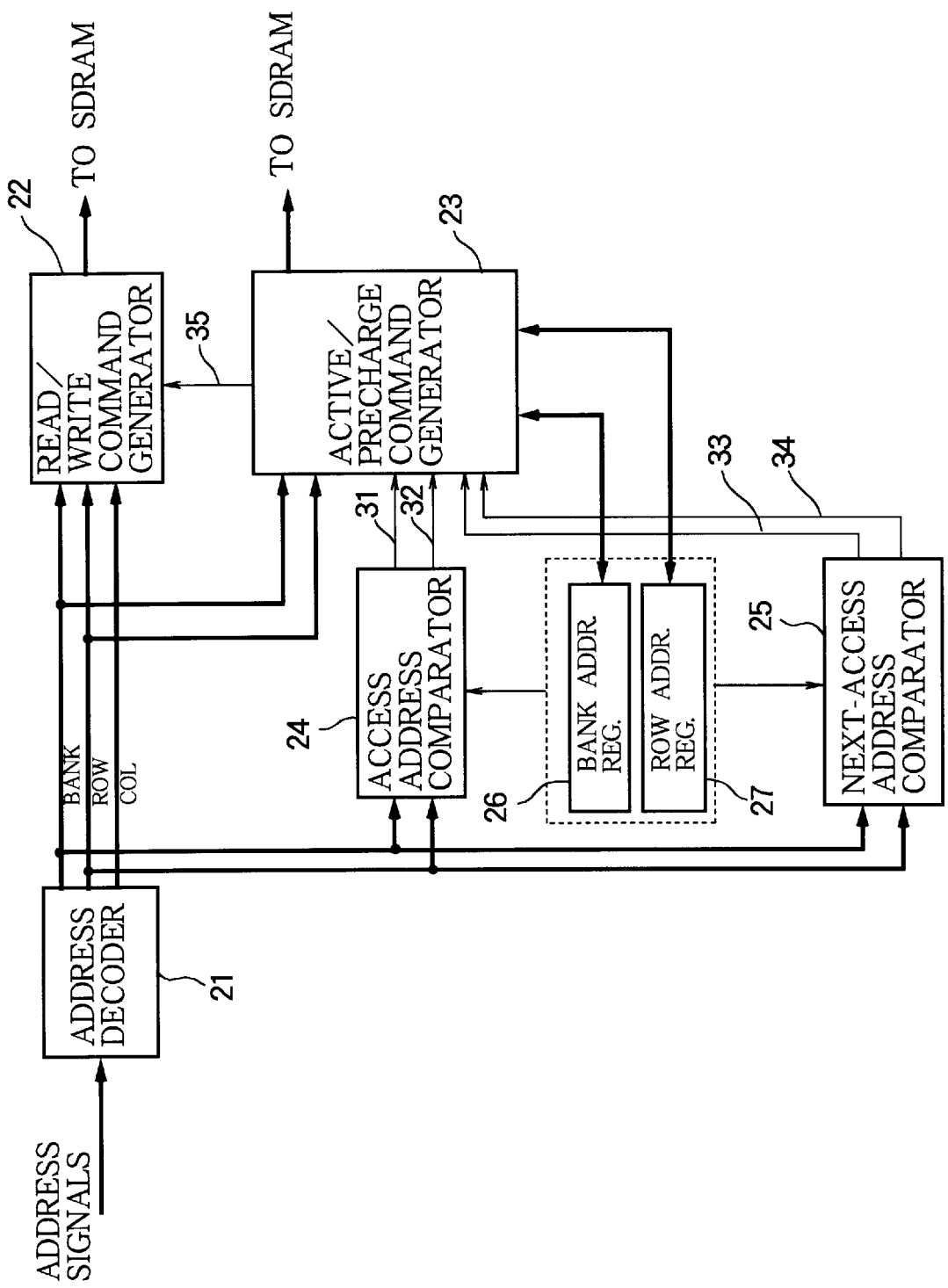
FIG. 4 is a block diagram of a first embodiment of the invented DRAM interface circuit.

FIG. 4 shows the internal structure of a DRAM interface circuit according to a first embodiment of the invention, which can be used as the DRAM interface circuit 13 in FIG. 1. The DRAM interface circuit in FIG. 4 includes an address decoder 21, a read/write command generator 22, an active/precharge command generator 23, an access address comparator 24, a next-access address comparator 25, a bank address register (Addr. Reg.) 26, and a row address register 27.

The DRAM interface circuit of the first embodiment controls access to a DRAM having a plurality of banks, each bank having a plurality of rows, in such a way that in access to a consecutive series of row addresses, every row-to-row address transition is made between two rows in different banks. In access to a first row (e.g., ROW0 in BANK0) followed by access to a second row at a consecutive row address (e.g., ROW0 in BANK1), the DRAM interface circuit initiates activation of the second row in parallel with the access to the first row, and precharges the first row in parallel with the access to the second row after access shifts from the first row to the second row.

The DRAM interface circuit may carry out these access operations according to continuously received address signals, or according to address signals generated internally by an address counter. When access shifts to the second row, in parallel with the access to the second row, the DRAM interface circuit also activates a new row that will be accessed next if access continues in consecutive row order.

In the following description, the row address and bank address of the row currently being accessed will be referred to as the access row address and access bank address, and the row address and bank address of the row that will be accessed next, if access continues in consecutive row address sequence, will be referred to as the next-access row address and next-access bank address.

The address decoder 21 receives address signals via the internal bus 11 in FIG. 1, and decodes the address signals to obtain seventeen-bit address data r8r7r6r5r4r3r2r1r0b1b0c5c4c3c2c1c0 data, referred to below as the input row/bank/column address. The various parts of the decoded address data will be referred to as the input row address, the input bank address, and the input column address, indicated as BANK, ROW, and COL in FIG. 4. The input row address and input bank address together constitute an input row/bank address.

The bank address register 26 stores the access bank address. Similarly, the row address register 27 stores the access row address. Although shown as two separate registers, the bank address register 26 and row address register 27 may be separate parts of a single address register.

The access address comparator 24 compares the input bank address obtained from the address decoder 21 with the access bank address stored in the bank address register 26, and outputs a bank address comparison result signal 31 that is low if the two bank addresses agree and high if they disagree. The access address comparator 24 also compares the input row address generated by the address decoder 21 with the access row address held in the row address register 27 and outputs a row address comparison result signal 32 that is low if the two row addresses agree and high if they disagree. In other words, the access address comparator 24 compares the input row/bank address with the access row/bank address and generates a pair of address comparison result signals 31, 32.

The next-access address comparator 25 compares the input bank address generated by the address decoder 21 with the next-access bank address and outputs a bank address comparison result signal 33 that is low if the two bank addresses agree and high if they disagree. The next-access address comparator 25 also compares the input row address generated by the address decoder 21 with the next-access row address and outputs a row address comparison result signal 34 that is low if the two row addresses agree and high if they disagree. In other words, the next-access address comparator 25 compares the input row/bank address with the next-access row/bank address and generates a pair of address comparison result signals 33, 34. The next-access address comparator 25 generates the next-access row/bank address with reference to the access row/bank address stored in the address registers 26, 27.

The read/write command generator 22 receives the input row/bank/column address from the address decoder 21 and receives a command enable signal 35 from the active/precharge command generator 23. The command enable signal 35 indicates whether a Read or Write command can be issued. When the command enable signal is high, the read/write command generator 22 issues a Read or Write command to the SDRAM 14 in FIG. 1, thereby accessing data at the input row/bank/column address.

The active/precharge command generator 23 issues Active commands and Precharge commands, and uses the above command enable signal 35 to disable the issuing of Read and Write commands. The active/precharge command generator 23 also generates the next-access row/bank address with reference to the access row/bank address held in the address registers 26, 27, and has an internal register (not visible) that stores a flag bit indicating whether the access row is active or not.

The active/precharge command generator 23 operates in three ways (A1–A3) depending on whether the input row/bank address matches the access row/bank address or the next-access row/bank address.

(A1) When the input row/bank address matches the access row/bank address (when bank address comparison result signal 31 and row address comparison result signal 32 are both low), the active/precharge command generator 23 immediately enables the issuance of Read and Write commands by holding the command enable signal 35 at the high level.

(A2) When the input row/bank address matches the next-access row/bank address (when bank address comparison result signal 33 and row address comparison result signal 34 are both low), the active/precharge command generator 23 immediately enables the issuance of Read and Write commands by holding the command enable signal 35 at the high level, issues a Precharge command for the access row/bank address currently stored in the address registers 26, 27, sets the input row/bank address in the address registers 26, 27 as a new access row/bank address, generates a corresponding new next-access row/bank address, and issues an Active command for the new next-access row/bank address.

(A3) When the input row/bank address matches neither the access row/bank address nor the next-access row/bank address (when either bank address comparison result signal 31 or row address comparison result signal 32, or both, are high, and in addition, either bank address comparison result signal 33 or row address comparison result signal 34, or both, are high), the active/precharge command generator 23 disables the issuance of Read and Write commands by driving the command enable signal 35 to the low level, issues Precharge commands for the access row/bank address and the next-access row/bank address, issues an Active command for the input row/bank address, sets the input row/bank address in the address registers 26, 27 as a new access row/bank address, generates a corresponding new next-access row/bank address, issues an Active command for the new next-access row/bank address, waits for the new access row to become active, then enables the issuance of Read and Write commands by driving the command enable signal 35 to the high level.

The above operations (A1–A3) of the active/precharge command generator 23 take place during a series of access operations in response to the continuous input of a series of address signals. These operations cannot be used at the beginning of the series (for example, when the first address signal is input at power-up, or following a reset or an interruption of address signal input), because then all rows of the SDRAM are idle.

At the beginning of a series of accesses, the active/precharge command generator 23 ignores the address comparison result signals 31–34, issues an Active command for the input row/bank address, sets the input row/bank address in the address registers 26, 27 as a new access row/bank address, generates a corresponding new next-access row/bank address, issues an Active command for the new next-access row/bank address, waits for the new access row to become active, and then enables the issuance of Read and Write commands by driving the command enable signal 35 to the high level.

At the end of a series of accesses (when continuous input of address signals ceases), the active/precharge command generator 23 issues Precharge commands for the access row and next-access row, and disables the issuance of Read and Write commands by driving the command enable signal 35 to the low level.

It is also possible for the access row and next-access row to be left active, in which case the active/precharge command generator 23 need do nothing at the end of the series of accesses, and can carry out the operations A1–A3 described above at the beginning of the next series of accesses.

The overall operation of a DRAM interface circuit according to the first embodiment will now be described, for the case of continuous input of address data from 000000000 00 000000 to 000000000 01 111111, starting from a state in which all rows are idle. Input of these address data cause row/bank/column addresses from 000000000/00/000000 to 000000000/01/111111 to be accessed, the series of accesses including a transition from row/bank address 000000000/00 to row/bank address 000000000/01. For descriptive purposes, the operation will be broken down into steps numbered from eleven to sixteen below.

Step Eleven

Upon receiving the first address data 000000000 00 000000 from the internal bus 11 in FIG. 1, the address decoder 21 decodes the address signals to generate an input row address 000000000, an input bank address 00, and an input column address 000000, sends the input row/bank address to the active/precharge command generator 23, the access address comparator 24, and the next-access address comparator 25, and sends the input row/bank/column address to the read/write command generator 22.

Since this is the beginning of a series of accesses and all rows in the SDRAM are idle, the active/precharge command generator 23 ignores the address comparison result signals 31, 32, 33, 34, issues an Active command for the new access row/bank address 000000000/00 (the input row/bank address), sets this new access row/bank address in the address registers 26, 27, issues an Active command for the new next-access row/bank address 000000000/01, waits for the new access row to become active, and then drives the command enable signal 35 to the high (active) level.

When the command enable signal 35 goes high, the read/write command generator 22 issues a Read command or a Write command for row/bank/column address 000000000/00/000000.

Step Twelve

Upon receiving the next address data 000000000 00 000001, the address decoder 21 decodes the address signals to generate an input row/bank/column address 000000000/00/000001.

The access address comparator 24 compares the input bank address 00 with the access bank address 00 and the; input row address 000000000 with the access row address 000000000. Since both pairs of addresses agree, the access address comparator 24 sends low address comparison result signals 31, 32 to the active/precharge command generator 23.

The next-access address comparator 25 compares the input bank address 00 with the next-access bank address 01 and the input row address 000000000 with the next-access row address 000000000. Since the row addresses agree but the bank addresses do not, the next-access address comparator 25 sends the active/precharge command generator 23 a high next-bank address comparison result signal 33 and a low next-row address comparison result signal 34.

By referring to the address comparison result signals 31, 32, 33, 34, the active/precharge command generator 23 finds that the input row/bank address 000000000/00 matches the access row/bank address, and since the access row is already active, the active/precharge command generator 23 holds the command enable signal 35 at the high (active) level. Since the command enable signal 35 remains high, the read/write command generator 22 immediately issues a Read or Write command for the input row/bank/column address 000000000/00/000001.

Step Thirteen

As further address signals giving address data 000000000 00 000010, 000000000 00 000011, . . . , 000000000 00 111111 are input, since the input row/bank address continues to match the access row/bank address 000000000/00, the command enable signal 35 remains high, and Read or Write commands for row/bank/column addresses from 000000000/00/000010 to 000000000/00/111111 are issued in a continuous series.

Step Fourteen

The next address signals to be received give the address data 000000000 01 000000, and are decoded by the address decoder 21 to yield an input row address 000000000, an input bank address 01, and an input column address 000000.

The access address comparator 24 compares the input row/bank address 000000000/01 with the access row/bank address 000000000/00. Since the bank addresses disagree while the row addresses agree, the output bank address comparison result signal 31 is low while the output row address comparison result signal is high. The next-access address comparator 25 compares the input row/bank address 000000000/01 with the next-access row/bank address 000000000/01. Since both the bank addresses and the row addresses agree, the output address comparison result signals 33, 34 are both low.

The active/precharge command generator 23 refers to the address comparison result signals 31, 32, 33, 34. Since the input row/bank address 000000000/01 matches the next-access row/bank address, and since the row at that address is already active, the active/precharge command generator 23 holds the command enable signal 35 at the high (active) level. During the subsequent access to the new access row, the active/precharge command generator 23 issues a Precharge command for the preceding row/bank address 000000000/00, sets the new access row/bank address 000000000/01 in the address registers 26, 27, and issues an Active command for the new next-access row/bank address 000000000/10.

Since the command enable signal 35 remains high, the read/write command generator 22 immediately issues a Read or Write command for the input row/bank/column address 000000000/01/000000.

Step Fifteen

As further address signals are received, giving address data from 000000000 01 000001 to 000000000 01 111111, operations similar to the above steps twelve and thirteen are carried out.

Step Sixteen

Following the reception of address data 000000000 01 111111, address signal input ceases, so the active/precharge command generator 23 issues Precharge commands for the access row/bank address 000000000/01 and next-access row/bank address 000000000/10 and drives the command enable signal 35 to the low level.

Figure 5:
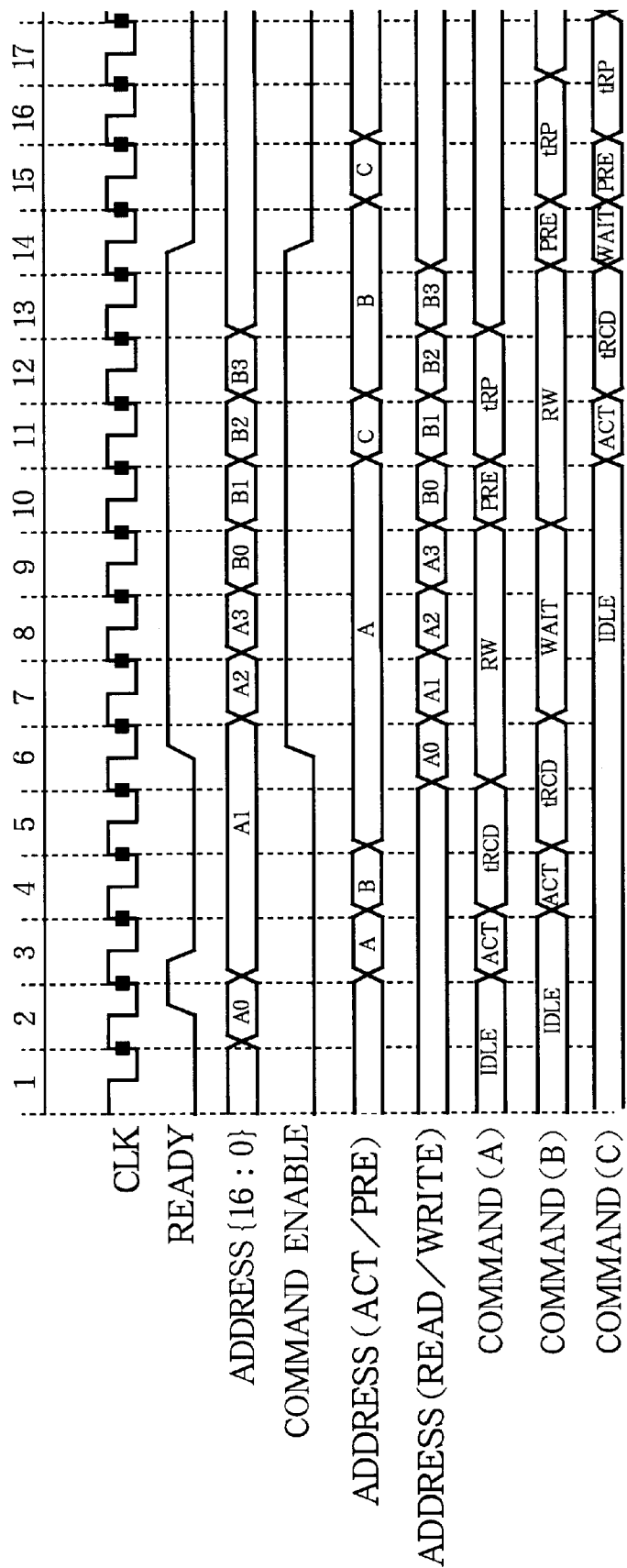
FIG. 5 is a timing diagram illustrating the operation of the first embodiment.

The timing of the foregoing operations is illustrated in FIG. 5. The DRAM interface circuit receives a clock (CLK) signal from the internal bus 11, and outputs a ready signal to the internal bus 11 to enable and inhibit input of address signals. ADDRESS{16:0} denotes the seventeen-bit row/bank/column address given by the address signals. 'Command enable' denotes the command enable signal 35. ADDRESS(ACT/PRE) and the letters A, B, C denote the row/bank address for which an Active command or Precharge command is issued. Rows A, B, and C are consecutive, so row B is disposed in a different bank from rows A and C. ADDRESS(READ/WRITE) and the symbols A0, A1, A2, A3, B0, B1, B2, B3 denote the row/bank/column address for which a Read or Write command is issued. Addresses A0, A1, A2, A3 are disposed in row A; addresses B0, B1, B2, B3 are disposed in row B. COMMAND(A), COMMAND(B), and COMMAND(C) denote commands issued for row/bank addresses A, B, and C, respectively. ACT denotes an Active command, PRE a Precharge command, and RW a Read or Write command; tRCD denotes a latency time provided to allow completion of the activation of a row for which an Active command has been issued; tRP denotes a latency time provided to allow completion of the precharging of a row for which a Precharge command has been issued.

In the first clock cycle (1) in FIG. 5, all row/bank addresses in the SDRAM are idle and the command enable signal 35 is at the low level.

In the second clock cycle (2), the ready signal goes high to enable address input, and the DRAM interface circuit receives address signals giving address A0. In the third clock cycle (3), the DRAM interface circuit receives the following address A1, and drives the ready signal low to disable further address input, as the active/precharge command generator 23 issues an Active command (ACT) for the input row/bank address A.

In the fourth clock cycle (4), while waiting for row A to become active, the active/precharge command generator 23 issues an Active command (ACT) for row/bank address B. In the fifth clock cycle (5), the active/precharge command generator 23 continues to wait for row A to become active, before driving the command enable signal 35 to the high level.

When the command enable signal 35 goes high in the sixth clock cycle (6), the DRAM interface circuit also drives the ready signal to the high level to re-enable address input, and the read/write command generator 22 issues a Read or Write command (RW) for row/bank/column address A0.

Address data A2, A3, and B0 are received in the seventh, eighth, and ninth clock cycles (7, 8, 9), while the read/write command generator 22 issues Read or Write commands (RW) for input row/bank/column addresses A1, A2, and A3.

In the tenth clock cycle (10), address signals giving address data B1 are received, the read/write command generator 22 issues a Read or Write command (RW) for input row/bank/column address B0, and the active/precharge command generator 23 issues a Precharge command (PRE) for row A. Row B, which was activated by the active (ACT) command in the fourth clock cycle, has been waiting for a Read or Write command since the seventh clock cycle; since the command enable signal 35 is high, the read/write command generator 22 is able to issue the Read or Write command immediately in the tenth clock cycle. This illustrates the capability of the first embodiment to maintain continuous access even when a row transition occurs.

In the eleventh clock cycle, address signals giving address data B2 are received, the read/write command generator 22 issues a Read or Write command (RW) for row/bank/column address B1, and the active/precharge command generator 23 issues an Active command (ACT) for row/bank address C. In the twelfth clock cycle (12), address signals giving address data B3 are received, and the read/write command generator 22 issues a Read or Write command for row/bank/column address B2.

In the thirteenth clock cycle (13), while the read/write command generator 22 issues a Read or Write command for input row/bank/column address B3, the DRAM interface circuit is notified of the end of continuous address input. In the fourteenth clock cycle (14) accordingly, the DRAM interface circuit drives the ready signal low and the active/precharge command generator 23 issues a Precharge command for row/bank address B. In the fifteenth clock cycle (15), the active/precharge command generator 23 issues a Precharge command for row/bank address C.

Figure 6:
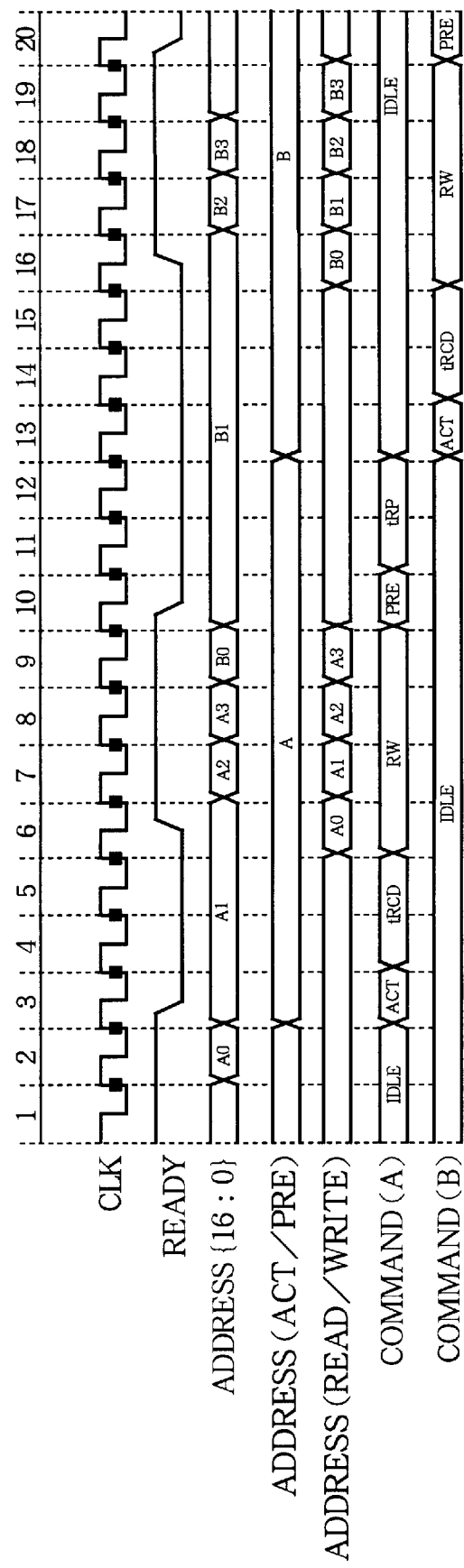
FIG. 6 is a timing diagram illustrating the operation of a conventional DRAM interface circuit.

For comparison, FIG. 6 shows the timing of the same series of accesses as performed by a conventional DRAM interface circuit, when rows A and B are in the same bank. The same notation is used as in FIG. 5, but the conventional DRAM interface circuit does not generate a command enable signal and does not issue commands for row/bank address C.

Row B remains idle during access to row A in the first nine clock cycles. Following input of row/bank/column address B0 in the ninth clock cycle, row A is precharged in the tenth to twelfth clock cycles; then row B is activated in the thirteenth to fifteenth clock cycles. Continuous access is accordingly interrupted during the tenth to fifteenth clock cycles, and the first Read or Write command for row B cannot be issued until the sixteenth clock cycle, which is six clock cycles later than in FIG. 5.

The first embodiment avoids interruptions such as these by ensuring that all consecutive row transitions are made between rows disposed in different banks, so that when access to a first row is followed by access to a second row, the second row can be activated during access to the first row, and the first row can be precharged during access to the second row. An anticipated next consecutive row can also be activated during the access to the second row. Continuous access can continue in this way as long as continuous input of address signals continues, provided all row transitions are consecutive. Total access time is thereby shortened, and data transfer rates can be maximized.

Figure 7:
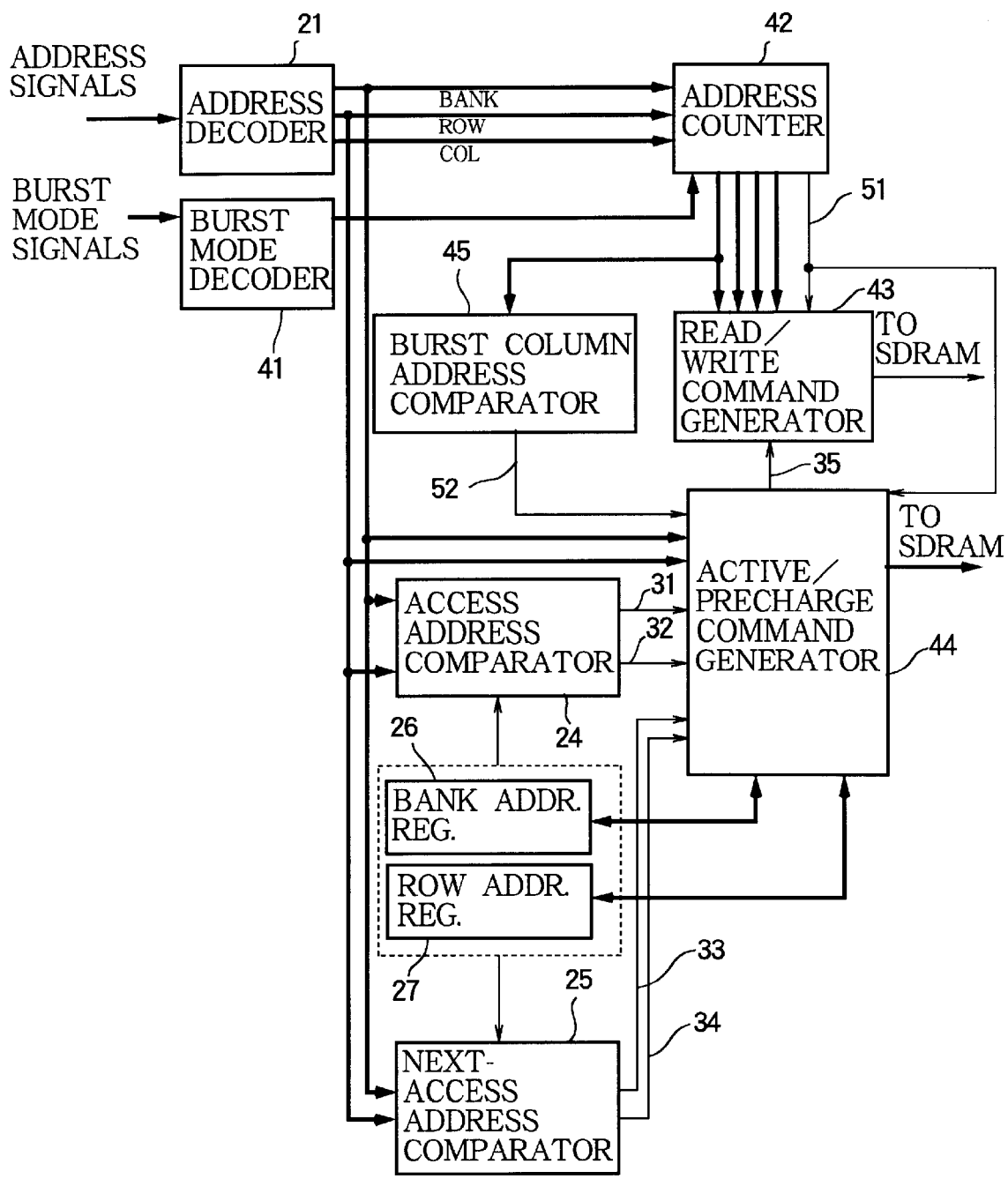
FIG. 7 is a block diagram of a second embodiment of the invented DRAM interface circuit.

FIG. 7 is a block diagram of a DRAM interface circuit illustrating a second embodiment of the invention. This DRAM interface circuit can also be used as the DRAM interface circuit 13 in the microprocessor in FIG. 1.

The DRAM interface circuit in FIG. 7 includes an address decoder 21, an access address comparator 24, a next-access address comparator 25, a bank address register 26, a row address register 27, a burst mode decoder 41, an address counter 42, a read/write command generator 43, an active/precharge command generator 44, and a burst column address comparator 45. The read/write command generator 43 replaces the address counter 42 of the first embodiment. The active/precharge command generator 44 replaces the active/precharge command generator 23 of the first embodiment. The burst mode decoder 41, address counter 42, and burst column address comparator 45 are additional elements not found in the first embodiment.

The DRAM interface circuit of the second embodiment, like that of the first embodiment, controls access to a DRAM having a plurality of banks, each bank having a plurality of rows, in such a way that in access to a consecutive series of row addresses, each row address transition is made between two rows in different banks. In access to a first row followed by access to a second row at a consecutive row address, the DRAM interface circuit initiates activation of the second row during access to the first row, and after access changes from the first row to the second row, precharges the first row during access to the second row.

The DRAM interface circuit of the second embodiment also controls access in a burst mode, according to signals giving the starting address and length of the burst. In burst-mode access, during the access to the second row mentioned above, the next row following the second row is also activated The address decoder 21 decodes address signals received from the internal bus 11 in FIG. 1 to obtain a seventeen-bit burst-starting row/bank/column address r8r7r6r5r4r3r2r1r0b1b0c5c4c3c2c1c0, and generates an input burst-starting row address r8r7r6r5r4r3r2r1r0, an input burst-starting bank address b1b0, and an input burst-starting column address c5c4c3c2c1c0 of the burst.

The burst mode decoder 41 decodes burst mode signals received from the internal bus 11 in FIG. 1 to obtain four-bit burst mode data designating one of a predetermined set of burst lengths, and outputs corresponding burst length data to the address counter 42. Depending on the four-bit burst mode signal, the burst length may be 1, 4, 8, 16, 32, 64, 128, 256, 512, 1024, 2048, or 4096. The burst mode signals are received at the same timing as the burst-starting address signals. When the burst length is equal to one (1), the DRAM interface circuit in FIG. 7 operates in the same way as the DRAM interface circuit of the first embodiment (shown in FIG. 4).

The address counter 42 begins counting up from the input burst-starting row/bank/column address output by the address decoder 21, continues counting for a number of counts designated by the burst length data output by the burst mode decoder 41, and sends a consecutive series of resulting row/bank/column address counts to the read/write command generator 43. The address counter 42 also generates a burst busy signal 51, which is held high during burst operations, that is, while the address counter 42 is counting, and goes low at the conclusion of a burst.

The input burst-starting row/bank/column address has the seventeen-bit structure explained above, the input burst-starting row address r8r7r6r5r4r3r2r1r0 occupying the most significant bit positions, the input burst-starting bank address b1b0 occupying middle bit positions, and the input burst-starting column address c5c4c3c2c1c0 occupying the least significant bit positions. The address counter 42 increments this address in the manner described in the first embodiment for access to a consecutive series of addresses, in steps of one. Accordingly, when a transition from one row to another row takes place during the counting process, the two rows are always disposed in different banks, as in the first embodiment. Thus in a burst access in the second embodiment, as in the consecutive address access described in the first embodiment, each pair of consecutive rows can be activated simultaneously, and one row can be precharged while the other row is being accessed, because the two rows are in different banks.

The read/write command generator 43 is similar to the read/write command generator 22 of the first embodiment, except that it receives the burst busy signal 51 as an additional input signal. The read/write command generator 43 issues Read and Write commands for the row/bank/column address counts received from the address counter 42, provided the issuance of such commands is enabled by the command enable signal 35 output from the active/precharge command generator 44 and provided also that the burst busy signal 51 received from the address counter 42 is high. In other words, the command enable signal 35 and burst busy signal 51 must both be high.

The burst column address comparator 45 tests the column address bits output by the address counter 42 by comparing them with the final column address (111111), and generates a row transition signal 52. The row transition signal 52 is set to the high level when the column address output by the address counter 42 reaches the final column address, and is reset to the low level when the address output by the address counter 42 returns to the initial column address (000000). By sending the row transition signal 52 to the active/precharge command generator 44, the burst column address comparator 45 notifies the active/precharge command generator 44 of row transitions.

The active/precharge command generator 44 receives the signals described in the first embodiment, as well as the burst busy signal 51 and row transition signal 52, issues Active commands and Precharge commands, and generates the command enable signal 35, which enables and disables the issuance of Read and Write commands. The active/precharge command generator 44 also refers to the access row/bank address stored in the address registers 26, 27 and generates a next-access row/bank address. In addition, the active/precharge command generator 44 has an internal register (not visible) storing a flag bit indicating whether the access row is active or not.

At the beginning of a burst, the active/precharge command generator 44 carries out one of the two operations B1 and B2 described below, depending on whether the access row and next-access row are active or not when the burst-starting address signals and burst mode signals are received.

(B1) If the access row and next-access row have already been precharged and are idle when the burst-starting address signals and burst mode signals are received, the active/precharge command generator 44 ignores the address comparison result signals 31–34 and operates as follows. This operation (B1) occurs when the burst-starting address signals and burst mode signals are not received immediately after the conclusion of the preceding burst.

The active/precharge command generator 44 issues an Active command for the input burst-starting row/bank address, sets the input burst-starting row/bank address in the address registers 26, 27 as a new access row/bank address, generates a corresponding new next-access row/bank address, issues an Active command for this next-access row/bank address, waits for the access row to become active, and then enables issuance of Read and Write commands by driving the command enable signal 35 to the high level.

(B2) If the access row and next-access row are both still active when the burst-starting address signals and burst mode signals are received, the active/precharge command generator 44 refers to the address comparison result signals 31–34 and operates as follows. This operation (B2) occurs when the burst-starting address signals and burst mode signals are input immediately after the conclusion of the preceding burst.

If the input burst-starting row/bank address matches the access row/bank address, the active/precharge command generator 44 immediately enables issuance of Read and Write commands by driving the command enable signal 35 to the high level.

If the input burst-starting row/bank address matches the next-access row/bank address, the active/precharge command generator 44 issues a Precharge command for the access row/bank address, and sets the input burst-starting row/bank address in the address registers 26, 27 as a new access row/bank address.

If the input burst-starting row/bank address differs from both the access row/bank address and the next-access row/bank address, the active/precharge command generator 44 disables the issuance of Read and Write commands by driving the command enable signal 35 to the low level, issues Precharge commands for the access row/bank address and the next-access row/bank address, issues an Active command for the input burst-starting row/bank address, sets the burst-starting row/bank address in the address registers 26, 27 as a new access row/bank address, generates a corresponding new next-access row/bank address, issues an Active command for the new next-access row/bank address, waits for the new access row to become active, and then enables issuance of Read and Write commands by driving the command enable signal 35 to the high level.

During the ensuing burst, from the start of the burst to the end of the burst, the active/precharge command generator 44 continuously enables the issuance of Read and Write commands by holding the command enable signal 35 at the high level. Whenever the column address count returns from the final column address (111111) to the initial column address (000000) during the burst, as indicated by a high-to-low transition of the row transition signal 52, the active/precharge command generator 44 recognizes a transition from the access row to the next-access row, issues a Precharge command for the access row/bank address, sets the next-access row/bank address in the address registers 26, 27 as a new access row/bank address, generates a corresponding new next-access row/bank address, and issues an Active command for the new next-access row/bank address.

At the end of a burst, the active/precharge command generator 44 takes no action if the burst-starting address signals and burst mode signals for the next burst are received immediately. If the next burst-starting address and burst mode signals are not received immediately, the active/precharge command generator 44 issues Precharge commands for the access row and next-access row, and disables the issuance of Read and Write commands by driving the command enable signal 35 low.

The invention is not limited to this operation at the end of a burst. It is also possible for the active/precharge command generator 44 to issue Precharge commands for the access row and next-access row at the conclusion of all bursts, in which case the access address comparator 24 and next-access address comparator 25 can be eliminated, but the active/precharge command generator 44 must carry out the operation B1 described above at the beginning of all bursts.

Alternatively, the active/precharge command generator 44 may leave the access row and next-access row active at the end of all bursts, in which case the active/precharge command generator 44 must carry out the operation B2 described above at the beginning of all bursts.

The operation of the DRAM interface circuit of the second embodiment will now be described for a burst with burst-starting address data 000000000 01 000000 and burst mode data 0111. The row/bank/column addresses accessed in this burst begin at 000000000 01 000000 and end at 000000001 01 000000.

First, the address decoder 21 in FIG. 7 receives burst-starting address signals designating burst-starting address data 000000000 01 000000 from the internal bus 11, decodes these signals to generate an input burst-starting row/bank/column address 000000000/01/000000, sends the input burst-starting row/bank address to the read/write command generator 22, access address comparator 24, next-access address comparator 25, and active/precharge command generator 44, and sends the input burst-starting row/bank/column address to the address counter 42.

Simultaneous with the input of the burst-starting address signals, the burst mode decoder 41 receives burst mode signals designating burst mode data 0111 from the internal bus 11, generates thirteen-bit burst length data 00001 00 000000 (designating a burst length of 256), and sends the burst length data to the address counter 42.

When the address counter 42 receives the input burst-starting row/bank/column address 000000000/01/000000 from the address decoder 21, it begins counting up from an initial seventeen-bit count value of 000000000 01 000000 and continues counting until this value has been incremented two hundred fifty-six times. Counting thus continues from the initial value 000000000 01 000000 to a value 000000001 01 000000 equal to the sum of the initial value and the burst length data 00001 00 000000.

By counting in this way, the address counter 42 generates a series of consecutive row/bank/column address counts from 000000000/01/000000 to 000000001/01/000000. These address counts are supplied in sequential order to the read/write command generator 43, and the column addresses are supplied to the burst column address comparator 45.

When the counting process starts, the address counter 42 outputs a row/bank/column address count of 000000000/01/000000 and sets the burst busy signal 51 to the high level to indicate that a burst operation has begun. When the last row/bank/column address count is output, the address counter 42 resets the burst busy signal 51 to the low level to indicate that the burst operation has ended.

The burst operation can be broken down into the following steps, numbered from twenty-one to twenty-five.

Step Twenty-One

When the input burst-starting row/bank/column address 000000000/01/000000 is input from the address decoder 21, the address counter 42 starts counting, and outputs a starting row/bank/column address count of 000000000/01/000000.

The burst column address comparator 45 receives the column-address part of the starting count (000000), compares it with the final column address (111111), and sets the row transition signal 52 to the low level since the two column addresses do not agree.

The active/precharge command generator 44 receives the input burst-starting row/bank address 000000000/01 from the address decoder 21. Assuming that the access row and next-access row are both idle (that is, that these rows were precharged at the end of the preceding burst), the active/precharge command generator 44 ignores the address comparison result signals 31–34, drives the command enable signal 35 to the low (inactive) level, issues an Active command for the input burst-starting row/bank address 000000000/01, sets this address in the address registers 26, 27 as a new access row/bank address, generates a corresponding new next-access row/bank address, waits for the new access row to become active, then drives the command enable signal 35 to the high (active) level and issues an Active command for the new next-access row/bank address 000000000/10. (If, contrary to the above assumption, the preceding access row and next-access row are still active, the active/precharge command generator 44 refers to the address comparison result signals 31–34 and carries out the operation B2 described earlier.)

The read/write command generator 43 waits for the command enable signal 35 to go high, then issues a Read or Write command for the starting row/bank/column address count 000000000/01/000000.

From this point until the end of the burst, the active/precharge command generator 44 holds the command enable signal 35 at the high level and ignores the address comparison result signals 31–34.

Step Twenty-Two

The address counter 42 now proceeds to output row/bank/column address counts from 000000000/01/000001 to 000000000/01/111110 in sequential order. The row transition signal 52 remains low and the command enable signal 35 remains high, so Read or Write commands are output sequentially for the row/bank/column addresses from 000000000/01/000001 to 000000000/01/111110.

Step Twenty-Three

Next, the address counter 42 outputs a row/bank/column address count of 000000000/01/111111. The burst column address comparator 45 finds that the column part of this address count (111111) matches the final column address (111111), and drives the row transition signal 52 to the high level.

Since the command enable signal 35 is still high, a Read or Write command is issued immediately for this row/bank/column address 000000000/01/111111.

Step Twenty-Four

Next, the address counter 42 outputs a row/bank/column address count of 000000000/10/000000. Since the column part of this address count (000000) does not match the final column address (111111), the burst column address comparator 45 drops the row transition signal 52 from the high level to the low level.

Since the row transition signal 52 has just gone low, indicating a transition from the access row to the next-access row, the active/precharge command generator 44 holds the command enable signal 35 at the high (active) level, issues a Precharge command for the access row/bank address 000000000/01, sets the next-access row/bank address 000000000/10 in the address registers 26, 27 as a new access row/bank address, and issues an Active command for the hew next-access row/bank address 000000000/11.

Since the command enable signal 35 remains at the high (active) level, the read/write command generator 43 immediately issues a Read or Write command for the row/bank/column address 000000000/10/000000 received from the address counter.

Since the row with row/bank address 000000000/10 was already activated during access to row/bank address 000000000/01, Read or Write commands can be issued continuously when the row transition occurs, enabling uninterrupted access to continue.

Step Twenty-Five

The operations described in step twenty-two continue as the address counter 42 generates row/bank/column address counts from 000000000/10/000001 to 000000000/10/111110, from 000000000/11/000001 to 000000000/11/111110, and from 000000001/00/000001 to 000000001/00/111110. The operations described in step twenty-three are carried out when the row/bank/column address count reaches 000000000/10/111111, 000000000/11/111111, and 000000001/00/111111. The operations described in step twenty-four are carried out when the row/bank/column address count changes to 000000000/11/000000 and 000000001/00/000000, and at the final row/bank/column address 000000001/01/000000.

The second embodiment controls burst access operations so that all row transitions take place between rows in different banks. The second row to be accessed is activated while the first row is being accessed. When access shifts from the first row to the second row, while the second row is being accessed, the new next-access row (a third row) is activated and the first row is precharged. Proceeding in this way, the burst access takes place continuously from beginning to end, enabling the access time to be shortened and data to be transferred with maximum efficiency. In addition, the burst length is variable, due to provision of the burst mode decoder 41 and address counter 42.

Figure 8:
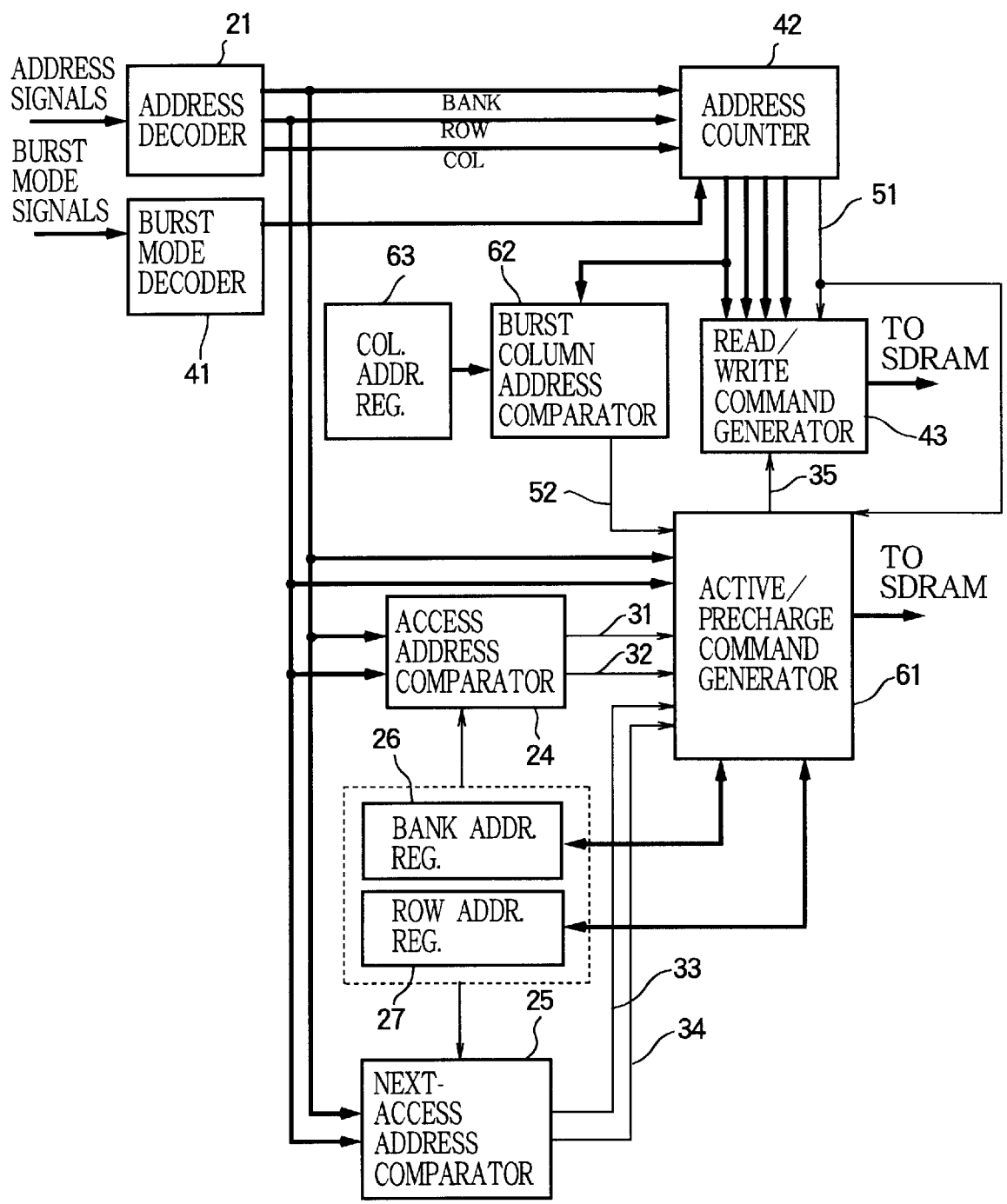
FIG. 8 is a block diagram of a third embodiment of,the invented DRAM interface circuit.

FIG. 8 is a block diagram of a DRAM interface circuit illustrating a third embodiment of the invention. This DRAM interface circuit can also be used as the DRAM interface circuit 13 in the microprocessor in FIG. 1.

The DRAM interface circuit in FIG. 8 includes an address decoder 21, an access address comparator 24, a next-access address comparator 25, a bank address register 26, a row address register 27, a burst mode decoder 41, an address counter 42, a read/write command generator 43, an active/precharge command generator 61, a burst column address comparator 62, and a column address register 63.

The DRAM interface circuit of the third embodiment thus adds a column address register 63 to the DRAM interface circuit of the second embodiment (FIG. 7), and replaces the active/precharge command generator 44 and burst column address comparator 45 of the second embodiment with an altered active/precharge command generator 61 and burst column address comparator 62.

As in the first and second embodiments, the DRAM interface circuit of the third embodiment controls access to a DRAM having a plurality of banks, each bank having a plurality of rows, in such a way that in access to a consecutive series of row addresses, each row address transition takes place between two rows in different banks. In access to a first row followed by access to a second row at a consecutive row address, the DRAM interface circuit initiates activation of the second row during access to the first row, and after access shifts from the first row to the second row, precharges the first row during the access to the second row.

The DRAM interface circuit of the third embodiment also controls burst-mode access according to input signals giving the starting address and length of the burst. In burst-mode access, in access to the second row mentioned above, when the access reaches a designated column address, a new (third) row is activated.

In other words, the DRAM interface circuit of the third embodiment modifies the timing of the activation of the new next-access row in the second embodiment so that the activation takes place when the column address count reaches a designated column address in the access row.

The designated column address is prestored in the column address register 63. The column address register 63 is programmable so that any column address from the initial address (000000) to the final address (111111) can be prestored, and the prestored column address can be changed.

The burst column address comparator 62 compares the column address count received from the address counter 42 to determine whether it has reached the designated column address prestored in the column address register 63, drives the row transition signal 52 to the high level if received column address count has reached the designated column address, and drives the row transition signal 52 to the low level if the column address count is short of the designated column address. The row transition signal 52 remains low while the address counter 42 counts up from the initial column address (000000) to the designated column address, goes high when the column address count reaches the designated column address, remains high while the address counter 42 counts up from the designated column address to the final column address (111111), and goes low when the count is reset to the initial column address (000000).

The active/precharge command generator 61 receives the same signals as the active/precharge command generator 44 described in the second embodiment. The active/precharge command generator 61 issues Active and Precharge commands, and enables and disables the issuance of Read and Write commands by means of the command enable signal 35. The active/precharge command generator 61 also refers to the access row/bank address stored in the address registers 26, 27 and generates a next-access row/bank address. In addition, the active/precharge command generator 61 has an internal register (not visible) storing flag bits indicating whether the access row and the next-access row are active or not.

At the beginning of a burst, the active/precharge command generator 61 carries out one of the three operations C1, C2 and C3 described below, depending on whether the access row and next-access row are active or not when the burst-starting address signals and burst mode signals are received.

(C1) If the access row and next-access row have already been precharged and are idle when the burst-starting address signals and burst mode signals are received, the active/precharge command generator 61 ignores the address comparison result signals 31–34 and operates as follows. This operation (C1) occurs when the burst-starting address signals and burst mode signals are not input immediately after the conclusion of the preceding burst. It will be assumed below that the access row designation has already become invalid in this case (C1).

The active/precharge command generator 61 issues an Active command for the input burst-starting row/bank address, sets the input burst-starting row/bank address in the address registers 26, 27 as a new access row/bank address, waits for the new access row to become active, and then enables issuance of Read and Write commands by driving the command enable signal 35 to the high level.

If the row transition signal 52 is high (due to setting of the column address count to the input burst-starting column address), the active/precharge command generator 61 also issues an Active command for the new next-access row/bank address.

(C2) If the access row and next-access row are both active when the burst-starting address and burst mode signals are received, the active/precharge command generator 61 refers to the address comparison result signals 31–34 and operates as follows. This operation (C2) occurs when the preceding burst ended at the above-mentioned designated column address or a higher column address, and the new burst-starting address signals and burst mode signals are received immediately after the conclusion of that preceding burst.

If the input burst-starting row/bank address matches the access row/bank address, the active/precharge command generator 61 immediately enables issuance of Read and Write commands by driving the command enable signal 35 to the high level. If the row transition signal 52 is low (due to setting of the column address count to the input burst-starting column address), the active/precharge command generator 61 also issues a Precharge command for the next-access row/bank address.

If the input burst-starting row/bank address matches the next-access row/bank address, the active/precharge command generator 61 immediately enables issuance of Read and Write commands (by driving the command enable signal 35 to the high level), issues a Precharge command for the access row/bank address, and sets the input burst-starting row/bank address in the address registers 26, 27 as a new access row/bank address.

If the input burst-starting row/bank address differs from both the access row/bank address and the next-access row/bank address, the active/precharge command generator 61 disables the issuance of Read and Write commands by driving the command enable signal 35 to the low level, issues Precharge commands for the access row/bank address and the next-access row/bank address, issues an Active command for the input burst-starting row/bank address, sets the input burst-starting row/bank address in the address registers 26, 27 as a new access row/bank address, waits for the new access row to become active, and then enables issuance of Read and Write commands by driving the command enable signal 35 to the high level.

(C3) If the access row is active when the burst-starting address signals and burst mode signals are received but the next-access row is idle, the active/precharge command generator 61 refers to address comparison result signals 31, 32 and operates as follows. This operation (C2) occurs when the column address had not yet reached the above-mentioned designated column address at the conclusion of the preceding burst, and the burst-starting address and burst mode signals are input immediately after the conclusion of that preceding burst.

If the input burst-starting row/bank address matches the access row/bank address, the active/precharge command generator 61 immediately enables issuance of Read and Write commands by driving the command enable signal 35 to the high level. If the row transition signal 52 is high (due to setting of the column address count to the input burst-starting column address), the active/precharge command generator 61 also issues an Active command for the next-access row/bank address.

If the input burst-starting row/bank address matches the next-access row/bank address, the active/precharge command generator 61 issues a Precharge command for the access row/bank address, issues an Active command for the input burst-starting row/bank address, sets the input burst-starting in the address registers 26, 27 as a new access row/bank address, waits for the new access row to become active, then enables issuance of Read and Write commands by driving the command enable signal 35 to the high level. If the row transition signal 52 is high (due to setting of the column address count to the input burst-starting column address), the active/precharge command generator 61 also issues an Active command for the new next-access row/bank address.

During the ensuing burst, from the start of the burst the end of the burst, the active/precharge command generator 61 continuously enables the issuance of Read and Write commands by holding the command enable signal 35 at the high level. When the row transition signal 52 changes from low to high during a burst, indicating that the column address in the access row has reached the designated column address, in parallel with access to the access row, the active/precharge command generator 61 issues an Active command for the next-access row/bank address. When the row transition signal 52 changes from high to low during a burst, indicating a transition from the access row to the next-access row, the active/precharge command generator 61 sets the next-access row/bank address in the address registers 26, 27 as a new access row/bank address, and issues a Precharge command for the former access row/bank address in parallel with access to the new access row.

At the end of a burst, the active/precharge command generator 61 operates in the same way as the active/precharge command generator 44 in the second embodiment. If the burst-starting address signals and burst mode signals of the next burst are received immediately, the active/precharge command generator 61 takes no action. If the next burst-starting address and burst mode signals are not received immediately, the active/precharge command generator 61 issues Precharge commands for the access row and next-access row (if it is active), and disables the issuance of Read and Write commands by driving the command enable signal 35 low.

It is also possible for the active/precharge command generator 61 to issue a Precharge command for the next-access row (if it is active) whenever the burst-starting address signals and burst mode signals for the next burst are received immediately. In this case, the next-access address comparator 25 can be eliminated, but the active/precharge command generator 61 must carry out the operation C3 described above at the beginning of the next burst.

The active/precharge command generator 61 does not necessarily have to issue Precharge commands for the access row and next-access row (if active) at the end of the burst. If these Precharge commands are not issued, the access address comparator 24 and next-access address comparator 25 can be eliminated, but the active/precharge command generator 61 must carry out the operation C1 described above at the beginning of the next burst.

It is also possible for the active/precharge command generator 61 to do nothing at the end of each burst, leaving the access row active and the next-access row either active or idle, as the case may be. The active/precharge command generator 61 must then carry out the operation C2 described above at the beginning of the next burst.

The operation of the DRAM interface circuit of the third embodiment will now be described for a burst with burst-starting address signals designating 000000000 01 000000 as burst-starting address data, and burst mode signals designating burst mode data 0111. The row/bank/column addresses accessed in this burst begin at 000000000 01 000000 and end at 000000001 01 000000. It will be assumed that column address 111100 is prestored in the column address register 63, and that the access row and next-access row are both idle when the burst-starting address signals and burst mode signals are received.

First, the address decoder 21 in FIG. 8 receives burst-starting address signals designating the burst-starting address data 000000000 01 000000 from the internal bus 11, and decodes these signals to generate an input burst-starting row/bank/column address 000000000/01/000000.

Simultaneous with the input of the burst-starting address signals, the burst mode decoder 41 in FIG. 8 receives burst mode signals designating burst mode data 0111, and generates thirteen-bit burst length data 00001 00 000000, designating a burst length of 256.

When the address counter 42 receives the input burst-starting row/bank/column address 000000000/01/000000, it drives the burst busy signal 51 to the high level, begins counting up from an initial seventeen-bit count value of 000000000 01 000000, and continues counting until this value has been incremented two hundred fifty-six times. Counting thus continues from the initial value 000000000 01 000000 to a value 000000001 01 000000 equal to the sum of the initial value and the burst length data 00001 00 000000.

By counting in this way, the address counter 42 generates a series of consecutive row/bank/column address counts from 000000000/01/000000 to 000000001/01/000000. These address counts are supplied in sequential order to the read/write command generator 43, and the column address counts are supplied to the burst column address comparator 45. When the address counter 42 outputs the starting row/bank/column address count 000000000/01/000000 (the input burst-starting row/bank/column address), it drives the burst busy signal 51 high to signal the beginning of the burst operation, and when it outputs the last row/bank/column address count 000000001/01/000000, it drives the burst busy signal 51 low to signal the end of the burst operation.

The burst operation can be broken down into the following steps, numbered from thirty-one to thirty-six.

Step Thirty-One

When the input burst-starting row/bank/column address 000000000/01/000000 is input from the address decoder 21, the address counter 42 outputs a starting row/bank/column address count of 000000000/01/000000 and begins counting.

The burst column address comparator 62 receives the column-address part of the starting count (000000), compares it with the column address 111100 stored in the column address register 63, and sets the row transition signal 52 to the low level since the two column addresses do not agree.

The active/precharge command generator 61 receives the input burst-starting row/bank address 000000000/01 from the address decoder 21. Since the preceding access row and next-access row are both idle (no row is currently designated as an access row), the active/precharge command generator 61 ignores the address comparison result signals 31–34, drives the command enable signal 35 to the low (inactive) level, issues an Active command for the input burst-starting row/bank address 000000000/01, sets the input burst-starting row/bank address in the address registers 26, 27 as a new access row/bank address, waits for the new access row to become active, then drives the command enable signal 35 to the high (active) level.

Since the row transition signal 52 pertaining to the starting column address count (000000) is low, the active/precharge command generator 61 does not issue an Active command for the new next-access row/bank address 000000000/10.

If the preceding access row were active and the preceding next-access row were idle, the active/precharge command generator 61 would refer to address comparison result signals 31, 32 and carry out the operation C3 described above. If the preceding access row and the preceding next-access row were both still active, the active/precharge command generator 61 would refer to address comparison result signals 31–34 and carry out the operation C2 described above.

The read/write command generator 43 waits for the command enable signal 35 to go high, then issues a Read or Write command for the starting row/bank/column address 000000000/01/000000.

From this point until the end of the burst, the active/precharge command generator 61 holds the command enable signal 35 at the high (active) level and ignores the address comparison result signals 31–34.

Step Thirty-Two

The address counter 42 now proceeds to output row/bank/column address counts from 000000000/01/000001 to 000000000/01/111011 in sequential order. The row transition signal 52 remains low and the command enable signal 35 remains high, so Read or Write commands are issued sequentially for these row/bank/column addresses 000000000/01/000001 to 000000000/01/111011.

Step Thirty-Three

Next, the row/bank/column address 000000000/01/111100 is output from the address counter 42. The burst column address comparator 62 finds that the column part of this address (111100) matches the column address (111100) stored in the column address register 63, and drives the row transition signal 52 to the high level.

When the row transition signal 52 goes high, since the command enable signal 35 is still high, the active/precharge command generator 61 issues an Active command for the next-access row/bank address 000000000/10.

Since the command enable signal 35 is high, the read/write command generator 43 immediately issues a Read or Write command for row/bank/column address 000000000/01/111100.

Step Thirty-Four

Row/bank/column address counts from 000000000/01/111101 to 000000000/01/111111 are now output sequentially from the address counter 42. During this interval, the row transition signal 52 remains high and the command enable signal 35 remains high, so Read or Write commands are issued promptly for these row/bank/column addresses (000000000/01/111101 to 000000000/01/111111).

Step Thirty-Five

Next, when the row/bank/column address count 000000000/10/000000 is output from the address counter 42, since the column part of this address (000000) falls short of the column address (111100) stored in the column address register 63, the burst column address comparator 62 drives the row transition signal 52 from the high level to the low level.

When the row transition signal 52 goes low, indicating a transition from the access row to the next-access row, the active/precharge command generator 61 holds the command enable signal 35 at the high (active) level, issues a Precharge command for the previous access row/bank address 000000000/01, and sets the new access row/bank address 000000000/10 in the address registers 26, 27.

Since the command enable signal 35 remains at the high (active) level, the read/write command generator 43 immediately issues a Read or Write command for row/bank/column address 000000000/10/000000.

Since the row with row/bank address 000000000/10 was activated when the access column address reached the designated column address (111100) in the preceding row, Read or Write commands can be issued continuously when the row transition occurs, enabling uninterrupted access to continue. Furthermore, since the next-access row can be activated just before the row transition takes place, the unnecessary power consumption that would occur if the next-access row were to be activated earlier and left to wait in the active state can be reduced to substantially zero.

Step Thirty-Six

The operations described in step thirty-two continue as the address counter 42 outputs row/bank/column address counts from 000000000/10/000001 to 000000000/10/111011, from 000000000/11/000001 to 000000000/11/111011, and from 000000001/00/000001 to 000000001/00/111011. The operations described in step thirty-three are carried out when the row/bank/column address count reaches 000000000/10/111100, 000000000/11/111100, and 000000001/00/111100. The operations described in step thirty-four are carried out as row/bank/column address counts from 000000000/10/111101 to 000000000/10/111111, from 000000000/11/111101 to 000000000/11/111111, and from 000000001/00/111101 to 000000001/00/111111 are output. The operations described in step thirty-five are carried out when the row/bank/column address count changes to 000000000/11/000000 and 000000001/00/000000, and at the final row/bank/column address count of 000000001/01/000000.

The third embodiment controls burst access operations so that all row transitions take place between rows in different banks, and activates the next-access row during access to the access row, when the column address in the access row reaches a designated column address. When access shifts from the access row to the next-access row, while the next-access row is being accessed, the row that was being accessed up to that point is precharged. Proceeding in this way, burst access takes place continuously from beginning to end, enabling access time to be shortened and data to be transferred with maximum efficiency. In addition, since the designated column address can be programmed so that the next-access row is activated just before the row transition occurs, the unnecessary power consumption that would occur if the next-access row were to be activated earlier and left to wait in the active state can be reduced to substantially zero.

Figure 9:
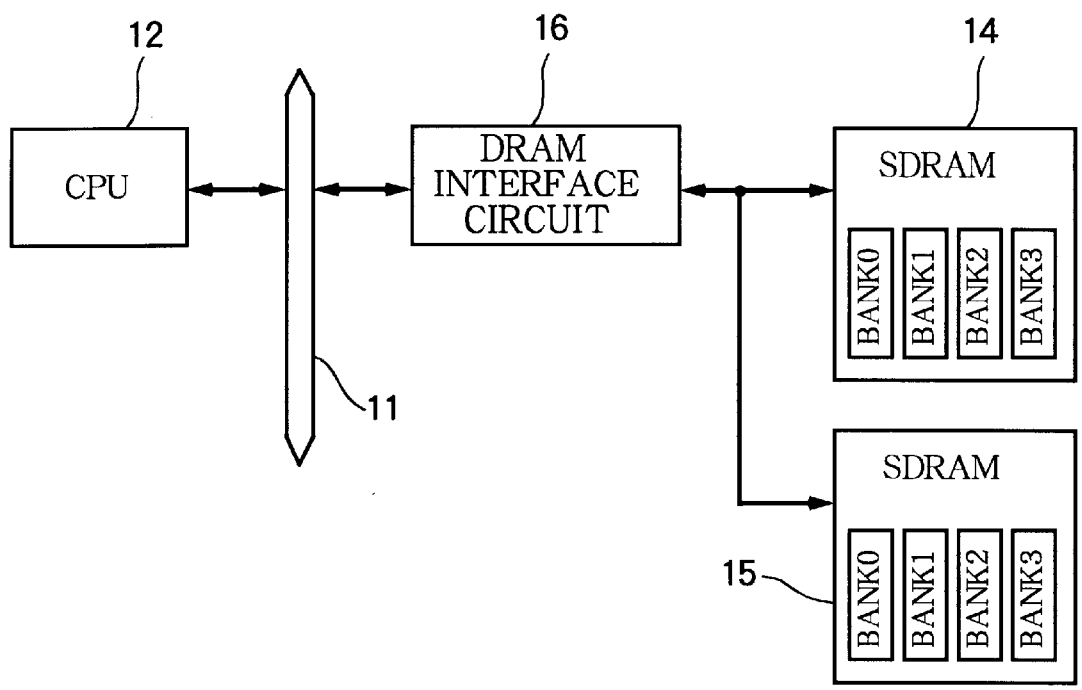
FIG. 9 is a block diagram of another microprocessor including a DRAM interface circuit of the invented type.

FIG. 9 is a block diagram of a microprocessor incorporating a fourth embodiment of the invention. The microprocessor in FIG. 9 includes an internal bus 11, a CPU 12, a DRAM interface circuit 13, and two synchronous DRAMs (SDRAMs) 14, 15. The CPU 12 in the microprocessor in FIG. 9 is connected through the internal bus 11 to the DRAM interface circuit 16, which is connected to the two SDRAMs 14, 15. The microprocessor in FIG. 9 is thus obtained from the microprocessor in FIG. 1 by adding one SDRAM 15, and replacing the DRAM interface circuit 13 with a different DRAM interface circuit 16.

The DRAM interface circuit 16 controls read and write access to the SDRAMs 14, 15 according to address signals received via the internal bus 11. The DRAM interface circuit 16 selects one of the two SDRAMs 14, 15, and sends Read, Write, Active, and Precharge commands to the selected SDRAM. The address signals may be generated by the CPU 12, or by an address signal generating circuit, a magnetic recording device, or some other circuit or device (not visible) connected to the internal bus 11, in which case the address signals are generated according to control signals from the CPU 12 and are then output on the internal bus 11. SDRAM 15 has the same internal structure as SDRAM 14, shown in FIG. 3.

Figure 10:
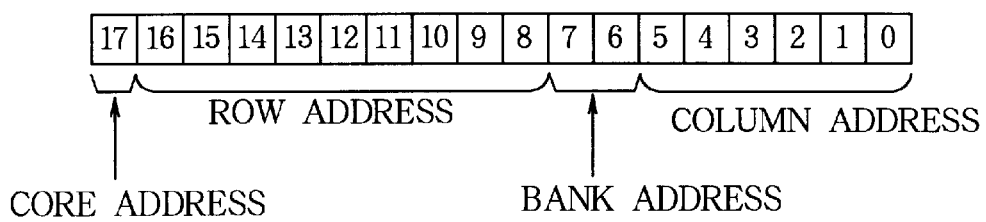
FIG. 10 shows an example of address bit assignments suitable for use in the invented DRAM interface circuit in FIG. 9.

Referring to FIG. 10, the DRAM interface circuit 16 decodes the input address signals to eighteen-bit address data, in which the most significant bit is a core address bit selecting either SDRAM 14 or SDRAM 15, the next nine bits are the row address, the next two bits are the bank address, and the last six bits are the column address. If the one-bit core address is d0, the nine-bit row address is r8r7r6r5r4r3r2r1r0, the two-bit bank address is b1b0, and the six-bit column address is c5c4c3c2c1c0, then the eighteen bits of address data are d0r8r7r6r5r4r3r2r1r0b1b0c5c4c3c2c1c0. The eighteen-bit address data in the DRAM interface circuit 16 are thus similar to the seventeen-bit address data in the DRAM interface circuit 13 in FIG. 1, but with an additional one-bit core address (d0) in the most significant bit position. It will be assumed below that core address zero (0) is the address of SDRAM 14 (the first SDRAM), and core address one (1) is the address of SDRAM 15 (the second SDRAM).

In access to consecutive addresses, the eighteen-bit address is incremented by one at a time. Since the core address occupies the most significant bit position of the eighteen-bit address data, the row address occupies the next-higher bit positions, the bank address occupies the middle bit positions, and the column address occupies the least significant bit positions, the bank address is incremented when the column address changes from 111111 to 000000, the row address is incremented when the bank address changes from 11 to 00, and the core address is incremented when the row address changes from 111111111 to 000000000.

Accordingly, when the addresses are accessed in consecutive order, the first row to be accessed is ROW0 in BANK0 in SDRAM 14, followed by ROW0 in BANK1 in SDRAM 14, . . . , ROWm−1 in BANK3 in SDRAM 14, ROW0 in BANK0 in SDRAM 15, ROW0 in BANK1 in SDRAM 15, . . . , ROWm−1 in BANK3 in SDRAM 15. In consecutive address access, accordingly, whenever the row changes, the bank also changes. When the row changes from ROWm−1 in BANK3 in SDRAM 14 to ROW0 in BANK0 in SDRAM 15, the SDRAM selection also changes.

Consequently, in access to consecutive addresses given by the eighteen-bit address data described above, since two consecutively accessed rows are always disposed in different banks, the second of the two rows can be activated while the first of the two rows is being accessed, and the first row can be precharged while the second row is being accessed.

The DRAM interface circuit 16 cannot send commands to the non-selected SDRAM, however, so if the first row and the second row are disposed in different SDRAMs, it is necessary to interrupt access to the first row (to stop sending Read and Write commands), select the SDRAM including the second row, issue an Active command for the second row, then reselect the SDRAM including the first row and resume access to the first row. The interruption of access to the first row can be as brief as one clock cycle, so access to the first row remains substantially continuous.

Figure 11:
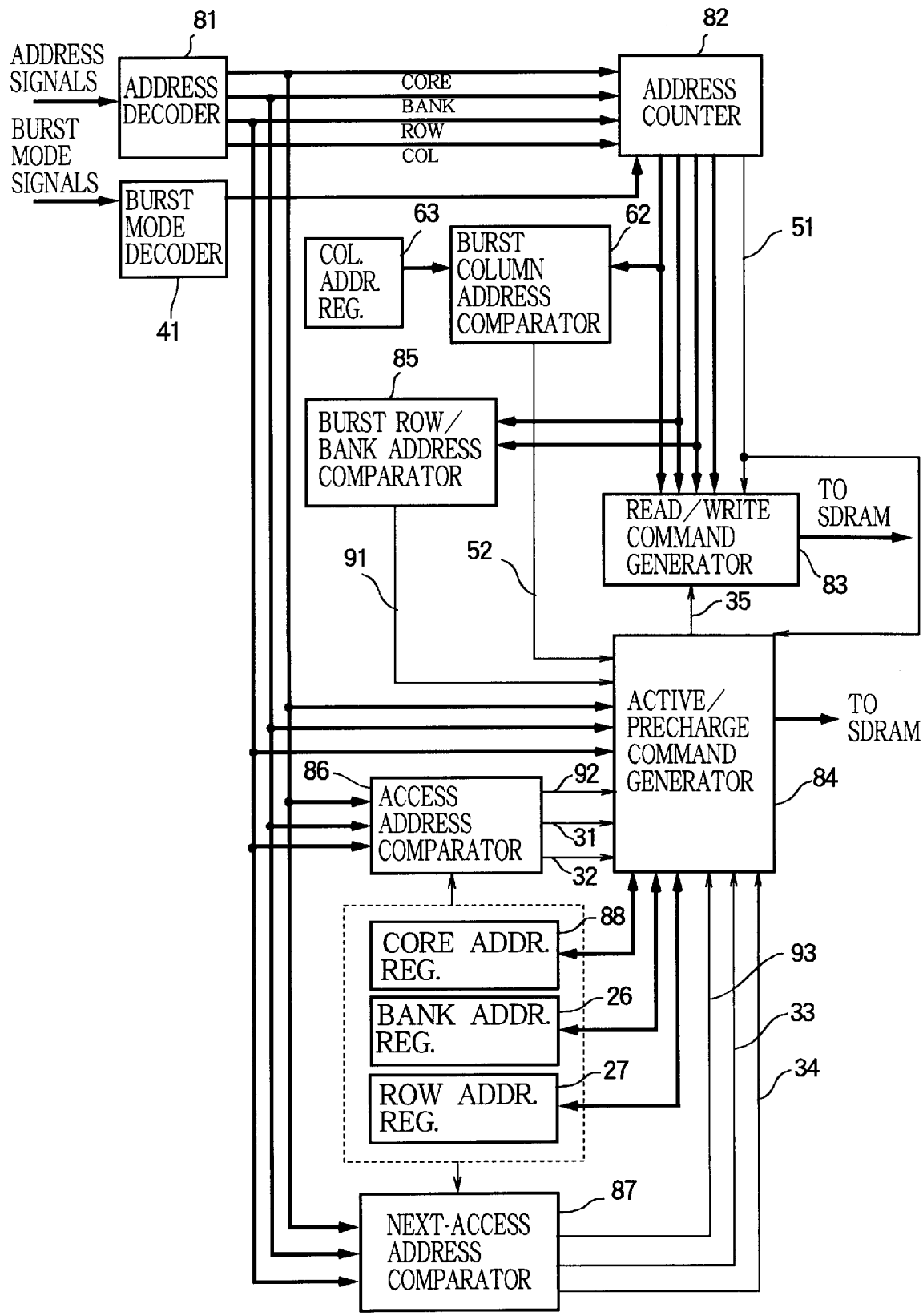
FIG. 11 is a block diagram of a fourth embodiment of the invented DRAM interface circuit.

FIG. 11 shows the internal structure of the DRAM interface circuit in the fourth embodiment of the invention. The DRAM interface circuit shown in FIG. 11 is used as the DRAM interface circuit 16 of the microprocessor in FIG. 9.

The DRAM interface circuit in FIG. 11 includes a bank address register 26, a row address register 27, a burst mode decoder 41, a burst column address comparator 62, a column address register 63, an address decoder 81, an address counter 82, a read/write command generator 83, an active/precharge command generator 84, a burst row/bank address comparator 85, an access address comparator 86, a next-access address comparator 87, and a core address register 88.

The DRAM interface circuit in the fourth embodiment is thus obtained from the DRAM interface circuit in the third embodiment (see FIG. 8) by adding a burst row/bank address comparator 85 and a core address register 88, and replacing address decoder 21 with address decoder 81, address counter 42 with address counter 82, read/write command generator 43 with read/write command generator 83, active/precharge command generator 61 with active/precharge command generator 84, access address comparator 24 with access address comparator 86, and next-access address comparator 25 with next-access address comparator 87.

The address decoder 81, address counter 82, read/write command generator 83, active/precharge command generator 84, access address comparator 86, and next-access address comparator 87 are similar to the address decoder 21, address counter 42, read/write command generator 43, active/precharge command generator 61, access address comparator 24, and next-access address comparator 25 in FIG. 8 with the addition of the core address as an input signal or an output signal.

The DRAM interface circuit of the fourth embodiment is thus similar to the DRAM interface circuit of the third embodiment, but is modified for control of access to a plurality of SDRAMs, so that if the access row and the next-access row are disposed in different SDRAMs, when access reaches a designated column in the access row, access to that row is briefly interrupted in order to activate the next-access row.

The address decoder 81 decodes address signals received via the internal bus 11 in FIG. 9 to obtain eighteen-bit burst-starting address data d0r8r7r6r5r4r3r2r1r0b1b0c5c4c3c2c1c0, generating an input burst-starting core address d0, an input burst-starting row address r8r7r6r5r4r3r2r1r0, an input burst-starting bank address b1b0, and an input burst-starting column address c5c4c3c2c1c0.

The address counter 82 begins counting up from the input burst-starting core/row/bank/column address obtained from the address decoder 81, continues counting for the count length designated by the burst length data generated by the burst mode decoder 41, and sends a consecutive series of core/row/bank/column address counts to the read/write command generator 83. The address counter 82 also generates a burst busy signal 51, which is held high while the address counter 82 is counting and goes low at the conclusion of the burst.

The input burst-starting core/row/bank/column address has the eighteen-bit structure described above, the input burst-starting core address bit d0 occupying the most significant bit position, the input burst-starting row address r8r7r6r5r4r3r2r1r0 occupying the next most significant bit positions, the input burst-starting bank address b1b0 occupying middle bit positions, and the input burst-starting column address c5c4c3c2c1c0 occupying the least significant bit positions. The core/row/bank/column address count is incremented by one at a time; the row/bank/column part of the address count increases in the same manner as the row/bank/column address in access to consecutive addresses in the first embodiment.

When the issuance of Read and Write commands is enabled (when the command enable signal 35 received from the active/precharge command generator 84 is high) and the burst busy signal 51 received from the address counter 82 is high, the read/write command generator 83 issues Read or Write, commands for the core/row/bank/column address counts received from the address counter 82. These Read and Write commands are sent to either the first or the second SDRAM, as selected by the active/precharge command generator 84.

The core address register 88 stores the core address of the selected SDRAM. This address will also be referred to as the core address of the access row, or the access core address. The addresses stored in the three address registers 26, 27, 28 will be referred to collectively as the access core/row/bank address.

The access address comparator 86 compares the input burst-starting core/row/bank address generated by the address decoder 81 with the access core/row/bank address, outputs a bank address comparison result signal 31 that is low if the two bank addresses agree and high if they disagree, outputs a row address comparison result signal 32 that is low if the two row addresses agree and high if they disagree, and outputs a core address comparison result signal 92 that is low if the two core addresses agree and high if they disagree.

The next-access address comparator 87 compares the input burst-starting core/row/bank address generated by the address decoder 81 with the next-access core/row/bank address, outputs a bank address comparison result signal 33 that is low if the two bank addresses agree and high if they disagree, outputs a row address comparison result signal 34 that is low if the two row addresses agree and high if they disagree, and outputs a next-access core address comparison result signal 93 that is low if the two core addresses agree and high if they disagree. The next-access address comparator 87 generates the next-access core/row/bank address with reference to the access core/row/bank address stored in the address registers 26, 27, 88.

The burst row/bank address comparator 85 determines whether the row/bank address count received from the address counter 82 has reached the final row/bank address (111111111/11), and generates a core transition signal 91. The core transition signal 91 is driven high when the row/bank address count reaches the final row/bank address, and is driven low when the row/bank address count returns to the initial row/bank address 000000000/00. By sending the core transition signal 91 to the active/precharge command generator 84, the burst row/bank address comparator 85 notifies the active/precharge command generator 84 of core address transitions.

The active/precharge command generator 84 is similar to the active/precharge command generator 61 in the third embodiment, but it also receives the core transition signal 91, the core address comparison result signal 92, and the next-access core address comparison result signal 93. The active/precharge command generator 84 selects either the first SDRAM or the second SDRAM, issues Active and Precharge commands to the selected SDRAM, and uses the command enable signal 35 to enable and disable the issuance of Read and Write commands. The active/precharge command generator 84 also generates the next-access core/row/bank address by referring to the access core/row/bank address stored in the address registers 26, 27, 88. In addition, the active/precharge command generator 84 has an internal register (not visible) storing flag bits indicating whether the access row and next-access row are active or not. When there is no need to change the SDRAM selection, the active/precharge command generator 84 is identical in operation to the active/precharge command generator 61 in the third embodiment.

When the access row has the final row/bank address 111111111/11 (when the core transition signal 91 is high), at the time when the column address reaches the designated column address (when the row transition signal 52 changes from low to high), the active/precharge command generator 84 disables the issuance of Read and Write commands, selects the second SDRAM, issues an Active command for the next-access core/row/bank address, then reselects the first SDRAM and re-enables the issuance of Read and Write commands. At the later time when the column address count returns from the final column address 111111 to the initial column address count 000000 (when the row transition signal 52 returns to the low level), the active/precharge command generator 84 disables the issuance of Read and Write commands, issues a Precharge command for the access row, then selects the second SDRAM and re-enables the issuance of Read and Write commands. When access shifts from the access row to the next-access row, while the new access row is being accessed, the active/precharge command generator 84 stores the core/row/bank address of the new access row in the address registers 26, 27, 88.

The operation of the DRAM interface circuit of the fourth embodiment will now be described for a burst with burst-starting address signals designating 0 111111111 11 000000 as burst-starting address data, and burst mode signals designating burst mode data 0110. Core/row/bank/column addresses from 0 111111111 11 000000 to 1 000000000 01 000000 are accessed in this burst. It will be assumed that column address 111100 is prestored in the column address register 63.

First, the address decoder 81 in FIG. 11 receives burst-starting address signals designating the burst-starting address data 0 111111111 11 000000 from the internal bus 11, and decodes these signals to generate an input burst-starting core/row/bank/column address 0/111111111/11/000000.

Simultaneous with the input of the burst-starting address signals, the burst mode decoder 41 in FIG. 11 receives burst mode signals designating burst mode data 0110, generates thirteen-bit burst length data 00000 10 000000, designating a burst length of 128, and sends the burst length data to the address counter 82.

When the address counter 82 receives the input burst-starting core/row/bank/column address 0/111111111/11/000000 from the address decoder 81, it begins counting up from a starting eighteen-bit count value of 0 111111111 11 000000, and continues counting until this value has been incremented one hundred twenty-eight times. Counting thus continues from the initial value 0 111111111 11 000000 to a value 1 000000000 01 000000 equal to the sum of the initial value and the burst length data 00000 10 000000.

The burst operation can be broken down into the following steps, numbered from forty-one to forty-six.

Step Forty-One

First, the address counter 82 outputs a starting core/row/bank/column address count of 0/111111111/11/0001000. The burst row/bank address comparator 85 finds that the input burst-starting row/bank address 111111111/11 received from the address counter 82 matches the final row/bank address 111111111/11, and drives the core transition signal 91 to the high level to indicate a core transition. Other operations are also carried out as described in step thirty-one in the third embodiment.

Step Forty-Two

Next, the address counter 82 outputs core/row/bank/column addresses from 0/111111111/11/000001 to 0/111111111/11/111011 in sequential order. Other operations are carried out as described in step thirty-two in the third embodiment.

Step Forty-Three

Next, the address counter 82 outputs core/row/bank/column address 0/111111111/11/111100. The burst column address comparator 62 finds that the column part of this address (111100) matches the column address. (111100) stored in the column address register 63, and drives the row transition signal 52 to the high level.

When the row transition signal 52 goes high, since the core transition signal 91 is also high, the active/precharge command generator 84 drives the command enable signal 35 to the low (inactive) level, selects the SDRAM with core address one (1), issues an Active command for the next-access core/row/bank address 1/000000000/00, then reselects the SDRAM with core address zero (0) and re-enables the issuance of Read and Write commands. The entire operation in step forty-three takes one clock cycle. When it becomes necessary to switch SDRAMs in order to activate the next-access row, accordingly, the burst access is interrupted for just one clock cycle, during which an Active command is issued.

The read/write command generator 83 waits for the command enable signal 35 to go high, then issues a Read or Write command for core/row/bank/column address count 0/111111111/11/111100.

Step Forty-Four

Core/row/bank/column address counts from 0/11111111/11/111101 to 0/11111111/11/111111 are now output sequentially from the address counter 82. Other operations are carried out as described in step thirty-two in the third embodiment.

Step Forty-Five

Next, when the address counter 82 outputs the row/bank/column address count 1/000000000/00/000000, since the column part of this address (000000) falls short of the column address (111100) stored in the column address register 63, the burst column address comparator 62 drives the row transition signal 52 from the high level to the low level. In addition, since the row/bank address 000000000/00 falls short of the final row/bank address 111111111/11, the burst row/bank address comparator 85 drives the core transition signal 91 from the high level to the low level.

The simultaneous high-to-low transitions of the row transition signal 52 and core transition signal 91 indicate a transition from an access row in one SDRAM to a next-access row in the other SDRAM. The active/precharge command generator 84 therefore drives the command enable signal 35 to the low (inactive) level, issues a Precharge command for the access core/row/bank address 0/11111111/11, then selects the SDRAM with core address '1' and re-enables the issuance of Read and Write commands. As the access row shifts to the next-access row, in parallel with access to this new access row, the active/precharge command generator 84 sets the new access core/row/bank address 1/000000000/00 in the address registers 26, 27, 99. Accordingly, when a row transition necessitates an SDRAM switchover, the burst operation is interrupted once again for one clock cycle, during which a Precharge command is issued.

The read/write command generator 83 waits for the command enable signal 35 to go high, then issues a Read or Write command for the core/row/bank/column address count 1/000000000/00/000000.

Step Forty-Six

Circuit operations equivalent to those described in steps thirty-two to thirty-five in the third embodiment continue as core/row/bank/column addresses 1/000000000/00/000001 to 1/000000000/01/000000 are counted out.

The fourth embodiment is an adaptation of the third embodiment for control of access to a plurality of SDRAMs. It is also possible to modify the first or second embodiment to control access to a plurality of SDRAMs.

If the first embodiment is used to control access to a plurality of SDRAMs, then in consecutive address access to three rows, of which the first and second rows are disposed in a first SDRAM and the third row, which will be accessed following the second row, is disposed in a second SDRAM, when the access row shifts from the first row to the second row, the second SDRAM is temporarily selected in order to activate the third row.

If access to a plurality of SDRAMs is controlled in this way, when the access row is the first row and the next-access row is the second row, if the input core/row/bank address matches the core/row/bank address of the second row, indicating a transition of the access row from the first row to the second row, the active/precharge command generator in the first embodiment sets the core/row/bank address of the second row in the address registers, disables the issuance of Read and Write commands, selects the second SDRAM, issues an Active command for the third row, then reselects the first SDRAM, re-enables the issuance of Read and Write commands, and issues a Precharge command for the first row during access to the second row.

When the access row is the second row and the next-access row is the third row, if the input core/row/bank address matches the core/row/bank address of the third row, indicating a transition of the access row from the second row to the third row, the active/precharge command generator in the first embodiment disables the issuance of Read and Write commands, issues a Precharge command for the second row, selects the second SDRAM, then re-enables the issuance of Read and Write commands, sets the core/row/bank address of the third row in the address registers, and issues an Active command for the new next-access row during access to the third row.

Similarly, if the second embodiment is used to control access to a plurality of SDRAMs, then in burst access to three rows, of which the first and second rows are disposed in a first SDRAM and the third row is disposed in a second SDRAM, when the access row shifts from the first row to the second row, the second SDRAM is temporarily selected in order to activate the third row.

If access to a plurality of SDRAMs is controlled in this way, when the access row is the first row, the next-access row is the second row, and the column address count returns from the final column address to the initial column address, indicating a transition of the access row from the first row to the second row, the active/precharge command generator in the second embodiment sets the core/row/bank address of the second row in the address registers, disables the issuance of Read and Write commands, selects the second SDRAM, issues an Active command for the third row, then reselects the first SDRAM, re-enables the issuance of Read and Write commands, and issues a Precharge command for the first row during access to the second row.

When the access row is the second row, the next-access row is the third row, and the column address count returns from the final column address to the initial column address, indicating a transition of the access row from the second row to the third row, the active/precharge command generator in the second embodiment disables the issuance of Read and Write commands, issues a Precharge command for the second row, selects the second SDRAM, then re-enables the issuance of Read and Write commands, sets the core/row/bank address of the third row in the address registers, and issues an Active command for the new next-access row during access to the third row.

The SDRAMs mentioned in any of the four preceding embodiments may be SDRAM cores disposed in the same integrated-circuit chip as the CPU, or they may be SDRAMs external to the CPU chip.

As explained above, in consecutive address access to a DRAM (to a continuous series of row addresses in the DRAM), the present invention controls the access so that all row transitions take place between different banks in the DRAM. If there is a transition from a first row to a second row, the present invention activates the second row while the first row is being accessed, and precharges the first row while the second row is being accessed, so that the access can proceed continuously from beginning to end, the total access time can be shortened accordingly, and maximum data transfer efficiency can be obtained.

A few variations of the preceding embodiments have been mentioned, but those skilled in the art will recognize that further variations are possible within the scope claimed below.

What is claimed is:

1. An interface circuit receiving address signals and controlling access to a dynamic random-access memory according to the address signals, the dynamic random-access memory having a plurality of banks, each bank having memory cells disposed in a plurality of rows, the interface circuit comprising:

an address decoder decoding the address signals so that if a series of said address signals are received in a consecutive address sequence, the series including a transition from a first row to a second row directly following the first row, then the first row and the second row are disposed in different banks in the dynamic random-access memory; and an active/precharge command generator, coupled to the address decoder, activating the second row while the first row is being accessed, and precharging the first row while the second row is being accessed.

2. The interface circuit of claim 1, wherein the active/precharge command generator also activates a third row while the second row is being accessed, the third row directly following the second row in the consecutive address sequence.

3. The interface circuit of claim 2 wherein, if access to the second row is followed by access to the third row, the active/precharge command generator activates a fourth row while the third row is being accessed, the fourth row directly following the third row in the consecutive address sequence, and if access to the second row is followed by access to a new row differing from the third row, the active/precharge command generator activates the new row.

4. The interface circuit of claim 2 wherein, if said series of said address signals begins from the first row, the active/precharge command generator activates the second row when said series of said address signals begins.

5. The interface circuit of claim 2, wherein the address decoder, by decoding the address signals, generates an input row/bank/column address including an input row/bank address designating an access row and an input column address designating a memory cell in the access row, and the active/precharge command generator generates an enable signal, further comprising:

a read/write command generator receiving the enable signal, and issuing an access command for the memory cell designated by the input row/bank/column address if the enable signal is active;

a register for storing an access row/bank address;

an access address comparator comparing the input row/bank address with the access row/bank address; and a next-access address comparator generating a next-access row/bank address directly following the access row/bank address in the consecutive address sequence, and comparing the input row/bank address with the next-access row/bank address;

the active/precharge command generator activating the enable signal if the input row/bank address matches the access row/bank address; and the active/precharge command generator activating the enable signal and setting the input row/bank address in said register as a new access row/bank address if the input row/bank address matches the next-access row/bank address.

6. The interface circuit of claim 2, controlling access to a plurality of dynamic random-access memories, the consecutive address sequence ranging across said plurality of dynamic random-access memories, wherein if said first row and said second row are disposed in a first one of the dynamic random-access memories and said third row is disposed in a second one of the dynamic random-access memories, when access shifts from said first row to said second row, the active/precharge command generator temporarily selects the second one of the dynamic random-access memories in order to activate said third row.

7. The interface circuit of claim 6, wherein the address decoder, by decoding the address signals, generates an input core/row/bank/column address including an input core/row/bank address designating an access row, and an input column address designating a memory cell in the access row, and the active/precharge command generator generates an enable signal, further comprising:

a read/write command generator receiving the enable signal and issuing an access command for the memory cell designated by the input core/row/bank/column address if the enable signal is active;

a register storing an access core/row/bank address;

an access address comparator comparing the input core/row/bank address with the access core/row/bank address; and a next-access address comparator generating a next-access core/row/bank address directly following the access core/row/bank address in the consecutive address sequence, and comparing the input core/row/bank address with the next-access core/row/bank address;

the active/precharge command generator setting the input core/row/bank address in said register as a new access core/row/bank address, inactivating the enable signal, selecting said second one of the dynamic random-access memories, issuing an activation command for said third row, then reselecting said first one of the dynamic random-access memories and reactivating the enable signal, if said first row and said second row are disposed in said first one of the dynamic random-access memories and said third row is disposed in said second one of the dynamic random-access memories, the access core/row/bank address designates said first row, and the input core/row/bank address matches the next-access core/row/bank address, indicating a transition of access from said first row to said second row; and the active/precharge command generator inactivating the enable signal, issuing a precharge command for said second row, then selecting said second one of the dynamic random-access memories, reactivating the enable signal, setting the input core/row/bank address in said register, and issuing an activation command for a row directly following said third row in the consecutive address sequence, if said first row and said second row are disposed in said first one of the dynamic random-access memories and said third row is disposed in said second one of the dynamic random-access memories, the access core/row/bank address designates said second row, and the input core/row/bank address matches the next-access core/row/bank address, indicating a transition of access from said second row to said third row.

8. The interface circuit of claim 1, wherein the interface circuit receives a burst mode signal, performs burst access with a burst length designated by the burst mode signal, and if access shifts from said first row to said second row during said burst access, the active/precharge command generator activates a third row while the second row is being accessed, the third row directly following the second row in the consecutive address sequence.

9. The interface circuit of claim 8 wherein, if said burst access starts from said first row, said active/precharge command generator activates said second row when said burst access starts.

10. The interface circuit of claim 8, wherein the address decoder, by decoding the address signals, generates a starting row/bank/column address including a starting row/bank address designating a starting row and a starting column address designating a memory cell in the starting row, and the active/precharge command generator generates an enable signal, further comprising:

a burst mode decoder decoding the burst mode signal to obtain burst length data designating the burst length;

a register storing an access row/bank address;

an address counter counting from the starting row/bank/column address for the burst length designated by the burst length data, thereby generating a row/bank/column address count including a row/bank address count and a column address count;

a read/write command generator receiving the enable signal and issuing an access command for a memory cell designated by the row/bank/column address count if the enable signal is active; and a burst column address comparator comparing the column address count with a final column address;

the active/precharge command generator activating the enable signal continuously during said burst access; and the active/precharge command generator issuing a precharge command for the access row/bank address, setting the row/bank address count in said register as a new access row/bank address, and issuing an activation command for a new next-access row/bank address directly following the new access row/bank address in the consecutive address sequence, when the column address count returns from the final column address to an initial column address.

11. The interface circuit of claim 8, controlling access to a plurality of dynamic random-access memories, the consecutive address sequence ranging across said plurality of dynamic random-access memories, wherein if said first row and said second row are disposed in a first one of the dynamic random-access memories and said third row is disposed in a second one of the dynamic random-access memories, when access shifts from said first row to said second row, the active/precharge command generator temporarily selects the second one of the dynamic random-access memories in order to activate the third row.

12. The interface circuit of claim 11, wherein the address decoder, by decoding the address signals, generates a starting core/row/bank/column address including a starting core/row/bank address designating a starting row and a starting column address designating a memory cell in the starting row, and the active/precharge command generator generates an enable signal, further comprising:

a burst mode decoder decoding the burst mode signal to obtain burst length data designating the burst length;

a register storing an access core/row/bank address;

an address counter counting from the starting core/row/bank/column address for the burst length designated by the burst length data, thereby generating a core/row/bank/column address count including a core/row/bank address count and a column address count;

a read/write command generator receiving the enable signal and issuing an access command for a memory cell designated by the core/row/bank/column address count if the enable signal is active; and a burst column address comparator comparing the column address count with a final column address;

the active/precharge command generator setting the core/row/bank address count in said register as a new access core/row/bank address, inactivating the enable signal, selecting said second one of the dynamic random-access memories, issuing an activation command for said third row, then reselecting said first one of the dynamic random-access memories and reactivating the enable signal, if said first row and said second row are disposed in said first one of the dynamic random-access memories and said third row is disposed in said second one of the dynamic random-access memories, the access core/row/bank address designates said first row, and the column address count returns from the final column address to an initial column address, indicating a transition of access from the first row to the second row; and the active/precharge command generator inactivating the enable signal, issuing a precharge command for said second row, then selecting said second one of the dynamic random-access memories, reactivating the enable signal, setting the core/row/bank address count in said register, and issuing an activation command for a row directly following said third row in the consecutive address sequence, if said first row and said second row are disposed in said first one of the dynamic random-access memories and said third row is disposed in said second one of the dynamic random-access memories, the access core/row/bank address designates said second row, and the input core/row/bank address matches the next-access core/row/bank address, indicating a transition of access from said second row to said third row.

13. The interface circuit of claim 1, wherein the interface circuit receives a burst mode signal and performs burst access with a burst length designated by the burst mode signal, and if access shifts from said first row to said second row during said burst access, the active/precharge command generator activates a third row when said access reaches a designated column address in the second row, the third row directly following the second row in the consecutive address sequence.

14. The interface circuit of claim 13, wherein said designated column address is programmable.

15. The interface circuit of claim 13, wherein if said, burst access begins from said first row, the active/precharge command generator activates said second row when said burst access begins.

16. The interface circuit of claim 13, wherein if said burst access begins from said first row, the active/precharge command generator activates said second row when said burst access begins, provided said burst access begins from said designated column or a column following said designated column in said consecutive address sequence.

17. The interface circuit of claim 13, wherein the address decoder, by decoding the address signals, generates a starting row/bank/column address including a starting row/bank address designating a starting row and a starting column address designating a memory cell in the starting row, and the active/precharge command generator generates an enable signal, further comprising:
   a burst mode decoder decoding the burst mode signal to obtain burst length data designating the burst length;
   a register storing an access row/bank address;
   an address counter counting from the starting row/bank/column address for the burst length designated by the burst length data, thereby generating a row/bank/column address count including a row/bank address count and a column address count;
   a read/write command generator receiving the enable signal and issuing an access command for a memory cell designated by the row/bank/column address count if the enable signal is active;
   a column address register storing the designated column address; and
   a burst column address comparator comparing the column address count with the designated column address;
   the active/precharge command generator activating the enable signal continuously during said burst access;
   the active/precharge command generator issuing an activation command for a next-access row/bank address directly following the access row/bank address in the consecutive address sequence, when the column address count reaches the designated column address; and
   the active/precharge command generator issuing a precharge command for the access row/bank address and setting the row/bank address count in said register as a new access row/bank address, when the column address count returns from a final column address to an initial column address, indicating a transition of access from said access row/bank address to said next-access row/bank address.

18. The interface circuit of claim 13, controlling access to a plurality of dynamic random-access memories, the consecutive address sequence ranging across said plurality of dynamic random-access memories, wherein if said first row and said second row are disposed in a first one of the dynamic random-access memories and said third row is disposed in a second one of the dynamic random-access memories, when access reaches the designated column address in the second row, the active/precharge command generator temporarily selects the second one of the dynamic random-access memories in order to activate the third row.

19. The interface circuit of claim 18, wherein the address decoder, by decoding the address signals, generates a starting core/row/bank/column address including a starting core/row/bank address designating a starting row and a starting column address designating a memory cell in the starting row, and the active/precharge command generator generates an enable signal, further comprising:
   a burst mode decoder decoding the burst mode signal to obtain burst length data designating the burst length;
   a register storing an access core/row/bank address;
   an address counter counting from the starting row/bank/column address for the burst length designated by the burst length data, thereby generating a core/row/bank/column address count including a core/row/bank address count and a column address count, the core/row/bank address count including a core address count and a row/bank address count;
   a read/write command generator receiving the enable signal and issuing an access command for a memory cell designated by the core/row/bank/column address count if the enable signal is active;
   a column address register storing the designated column address;
   a burst column address comparator comparing the column address count with the designated column address; and
   a burst row/bank address comparator comparing the row/bank address count with a final row/bank address;
   the active/precharge command generator inactivating the enable signal, selecting said second one of the dynamic random-access memories, issuing an activation command for said third row, then reselecting said first one of the dynamic random-access memories and reactivating the enable signal, if said first row and said second row are disposed in said first one of the dynamic random-access memories and said third row is disposed in said second one of the dynamic random-access memories, the access core/row/bank address designates said first row, the row/bank address count matches the final row/bank address, and the column count has reached the designated column address; and
   the active/precharge command generator issuing a precharge command for said first row and setting the core/row/bank address count in said register as a new access core/row/bank address, when the column address count returns from a final column address to an initial column address, indicating a transition of access from said first row to said second row.

20. A method of controlling access to a dynamic random-access memory according to address signals, the dynamic random-access memory having a plurality of banks, each bank having memory cells disposed in a plurality of rows, the method comprising the steps of:
   (a) decoding the address signals so that every row transition occurring in consecutive address sequence occurs between a pair of rows disposed in different banks in the dynamic random-access memory;
   (b) accessing a first row in the dynamic random-access memory;
   (c) activating a second row in the dynamic random-access memory while the first row is being accessed, the second row directly following the first row in said consecutive address sequence;
   (d) accessing the second row immediately after access to the first row; and
   (e) precharging the first row while the second row, is being accessed.

21. The method of claim 20, wherein said steps (b) and (d) are carried out in a single continuous burst.

22. The method of claim 20, wherein said step (c) is carried out when access reaches a designated location in said first row.

23. The method of claim 22, further comprising the step of programming said designated location by setting a column address in a register.

24. A method of controlling access to a first dynamic random-access memory and a second dynamic random-access memory according to address signals, the first dynamic random-access memory and the second dynamic random-access memory each having a plurality of banks, each bank having memory cells disposed in a plurality of rows, the method comprising the steps of:

(a) decoding the address signals so that in consecutive address sequence, every row from a first row to a next-to-last row in the first dynamic random-access memory is followed by a row in a different bank in the first dynamic random-access memory, a last row in the first dynamic random-access memory is followed by a first row in the second dynamic random-access memory, and every row from the first row to a next-to-last row in the second dynamic random-access memory is followed by a row in a different bank in the second dynamic random-access memory;

(b) selecting the first dynamic random-access memory;

(c) accessing the next-to-last row in the first dynamic random-access memory;

(d) activating the last row in the first dynamic random-access memory while the next-to-last row in the first dynamic random-access memory is being accessed;

(e) accessing the last row in the first dynamic random-access memory;

(f) precharging the next-to-last row in the first dynamic random-access memory while the last row in the first dynamic random-access memory is being accessed;

(g) temporarily interrupting access to the last row in the first dynamic random-access memory;

(h) selecting the second dynamic random-access memory;

(i) activating the first row in the second dynamic random-access memory; and (j) reselecting the first dynamic random-access memory and resuming access to the last row in the first dynamic random-access memory.

25. The method of claim 24, further comprising the steps of:

(k) precharging the last row in the first dynamic random-access memory when access to the last row in the first dynamic random-access memory ends;

(l) again selecting the second dynamic random-access memory; and (m) accessing the first row in the second dynamic random-access memory.

26. The method of claim 25, wherein said steps (c), (e), and (m) are carried out in a single burst.

27. The method of claim 24, wherein said step (d) is carried out when access reaches a designated location in the next-to-last row in the first dynamic random-access memory.

28. The method of claim 27, further comprising the step of programming said designated location by setting a column address in a register.

* * * * *